(12) United States Patent
Yang et al.

(10) Patent No.: US 11,563,008 B2
(45) Date of Patent: Jan. 24, 2023

(54) INTEGRATED MEMORY WITH REDISTRIBUTION OF CAPACITOR CONNECTIONS, AND METHODS OF FORMING INTEGRATED MEMORY

(71) Applicant: Micron Technology, Inc., Boise, ID (US)

(72) Inventors: Guangjun Yang, Meridian, ID (US); Vinay Nair, Boise, ID (US); Devesh Dadhich Shreeram, Boise, ID (US); Ashwin Panday, Boise, ID (US); Kangle Li, Boise, ID (US); Zhiqiang Xie, Meridian, ID (US); Silvia Borsari, Boise, ID (US); Mohd Kamran Akhtar, Boise, ID (US); Si-Woo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 54 days.

(21) Appl. No.: 17/194,859

(22) Filed: Mar. 8, 2021

(65) Prior Publication Data
US 2022/0285357 A1   Sep. 8, 2022

(51) Int. Cl.
  *H01L 27/108* (2006.01)
(52) U.S. Cl.
  CPC .. *H01L 27/10814* (2013.01); *H01L 27/10823* (2013.01); *H01L 27/10855* (2013.01)

(58) Field of Classification Search
None
See application file for complete search history.

(56) References Cited

U.S. PATENT DOCUMENTS

| 10,461,149 | B1* | 10/2019 | Tang | H01L 27/10855 |
| 11,195,838 | B2* | 12/2021 | Light | H01L 27/1085 |
| 2019/0326297 | A1* | 10/2019 | Ujihara | H01L 29/165 |
| 2020/0111673 | A1* | 4/2020 | Yang | H01L 21/3086 |
| 2021/0125997 | A1* | 4/2021 | Yang | H01L 27/0629 |
| 2021/0305254 | A1* | 9/2021 | Yang | H01L 27/10805 |
| 2022/0285357 | A1* | 9/2022 | Yang | H01L 27/10823 |

* cited by examiner

*Primary Examiner* — Steven M Christopher
(74) *Attorney, Agent, or Firm* — Wells St. John P.S.

(57) ABSTRACT

Some embodiments include an integrated assembly having digit-line-contact-regions between pairs of capacitor-contact-regions. The capacitor-contact-regions are arranged with six adjacent capacitor-contact-regions in a substantially rectangular configuration. Conductive plugs are coupled with the capacitor-contact-regions. Conductive redistribution material is coupled with the conductive plugs. Upper surfaces of the conductive redistribution material are arranged in a substantially hexagonal-close-packed configuration. Digit lines are over the digit-line-contact-regions. Insulative regions are between the digit lines and the conductive plugs. The insulative regions contain voids and/or low-k dielectric material. Capacitors are coupled with the upper surfaces of the conductive redistribution material.

25 Claims, 22 Drawing Sheets

INTEGRATED MEMORY WITH REDISTRIBUTION OF CAPACITOR CONNECTIONS, AND METHODS OF FORMING INTEGRATED MEMORY

TECHNICAL FIELD

Integrated assemblies. Integrated memory (e.g., DRAM). Integrated memory with redistribution of capacitor connections. Methods of forming integrated memory.

BACKGROUND

Memory is one type of integrated circuitry, and is used in computer systems for storing data. An example memory is DRAM (dynamic random-access memory). DRAM cells may each comprise a transistor in combination with a capacitor. The DRAM cells may be arranged in an array; with wordlines extending along rows of the array, and digit lines extending along columns of the array. The wordlines may be coupled with the transistors of the memory cells. Each memory cell may be uniquely addressed through a combination of one of the wordlines with one of the digit lines.

Tight packing of capacitors becomes increasingly important with increasing levels of integration. It is desired to develop architectures which enable tight packing of the capacitors of a DRAM array, and to develop methods for fabricating such architectures.

DETAILED DESCRIPTION OF THE ILLUSTRATED EMBODIMENTS

Some embodiments include methods of forming conductive redistribution structures which convert a rectangular pattern of interconnection regions (e.g., container-contact-regions of a DRAM array) to a hexagonal pattern (e.g., a pattern which is substantially hexagonal-close-packed). Some embodiments include integrated assemblies (e.g., DRAM assemblies) having patterns of interconnection regions which are substantially hexagonal-close-packed. Voids and/or low-k dielectric material may be proximate to the interconnection regions. Example embodiments are described with reference to the figures provided herewith.

Figure 1:
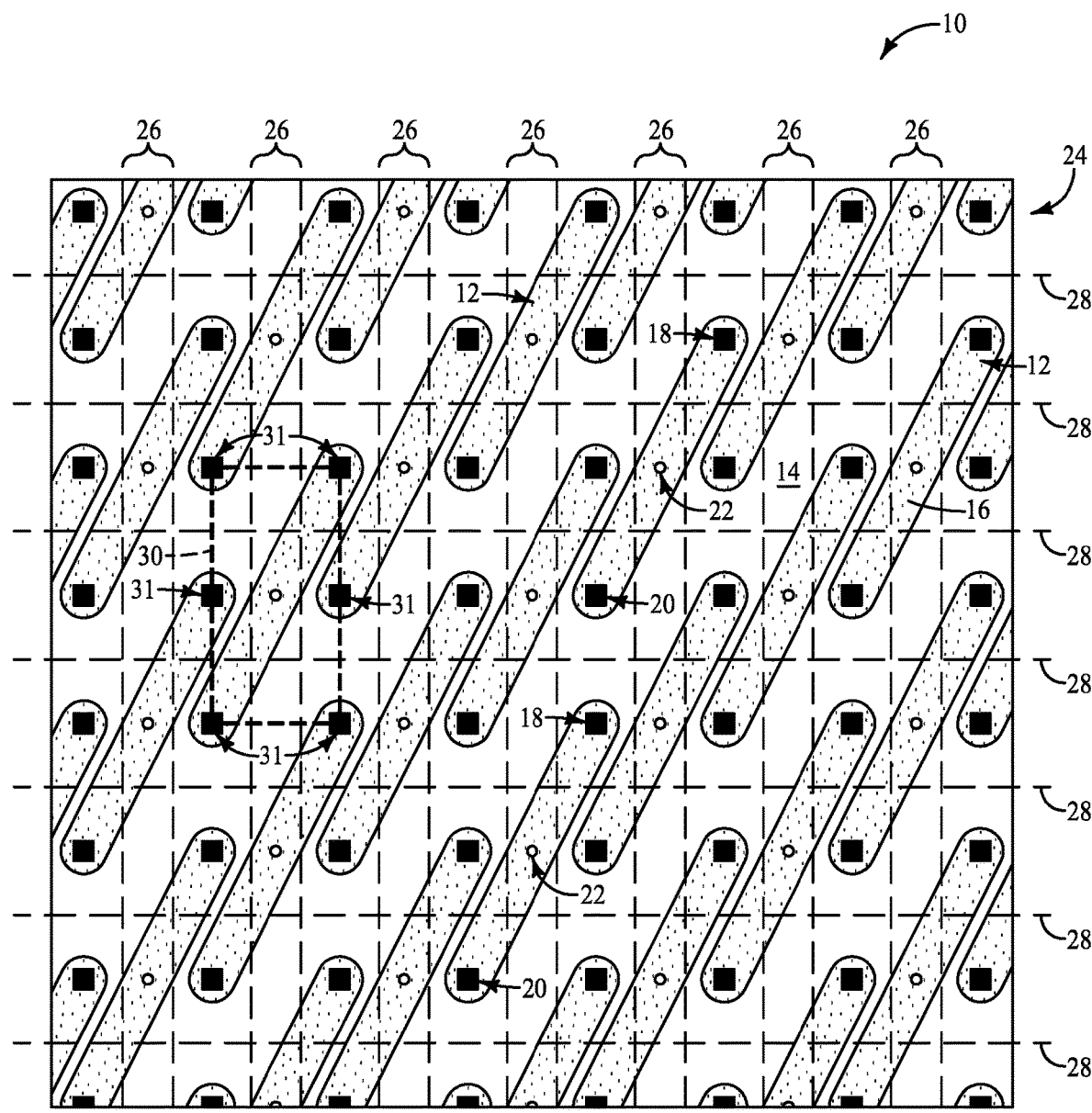
FIG. 1 is a diagrammatic top-down view of a region of an example memory array.

Referring to FIG. 1, a region of an integrated assembly 10 is shown in a diagrammatic top-down view. The assembly comprises a plurality of active regions 12 (only some of which are labeled), which are spaced from one another by insulative material 14. The active regions 12 are stippled to assist the reader in distinguishing them from the intervening insulative material 14.

The active regions 12 comprise semiconductor material 16. The semiconductor material 16 may comprise any suitable composition(s), and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material may comprise silicon. Such silicon may be in any suitable crystalline form (e.g., monocrystalline, polycrystalline, amorphous, etc.), and in some embodiments may comprise, consist essentially of, or consist of monocrystalline silicon with one or more suitable dopants provided therein.

Each of the active regions 12 is shown to include a pair of capacitor-contact-regions 18 and 20 (represented with square-shaped structures), and to comprise a digit-line-contact-region 22 between the capacitor-contact-regions. The digit-line-contact-regions 22 are represented by circle-shaped structures.

The capacitor-contact-regions 18 and 20 may be referred to as a first and second capacitor-contact-regions, respectively.

The capacitor-contact-regions 18, 20 may be considered to be distributed in an array 24. Digit lines 26 extend along columns of the array, and wordlines 28 extend along rows of the array.

The capacitor-contact-regions 18, 20 are arranged in a pattern such that six adjacent capacitor-contact-regions form a substantially rectangular configuration 30, with one of such rectangular configurations 30 being labeled and identified in FIG. 1. The term "substantially rectangular" means rectangular to within reasonable tolerances of fabrication and measurement. The six capacitor-contact-regions utilized in the rectangular configuration 30 of FIG. 1 are labeled as regions 31.

A difficulty encountered during fabrication of integrated memory is that it is desired to form storage elements (e.g., capacitors) which are electrically coupled with each of the capacitor-contact-regions 18, 20. The rectangular pattern 30 may limit the packing density of the storage elements. Accordingly, it may be desired to provide redistribution material over the capacitor-contact-regions 18, 20 to alter the pattern available for contact with storage elements.

The term "storage element" refers to any suitable device having at least two detectable states; and in some embodiments may be, for example, a capacitor, a resistive-memory device, a conductive-bridging device, a phase-change-memory (PCM) device, a programmable metallization cell (PMC), etc. For purposes of explaining example embodiments, the "storage elements" may be referred to as capacitors, and may be represented as capacitors. However, it is to be understood that in other embodiments such capacitors may be replaced with any suitable storage elements.

Figure 2:
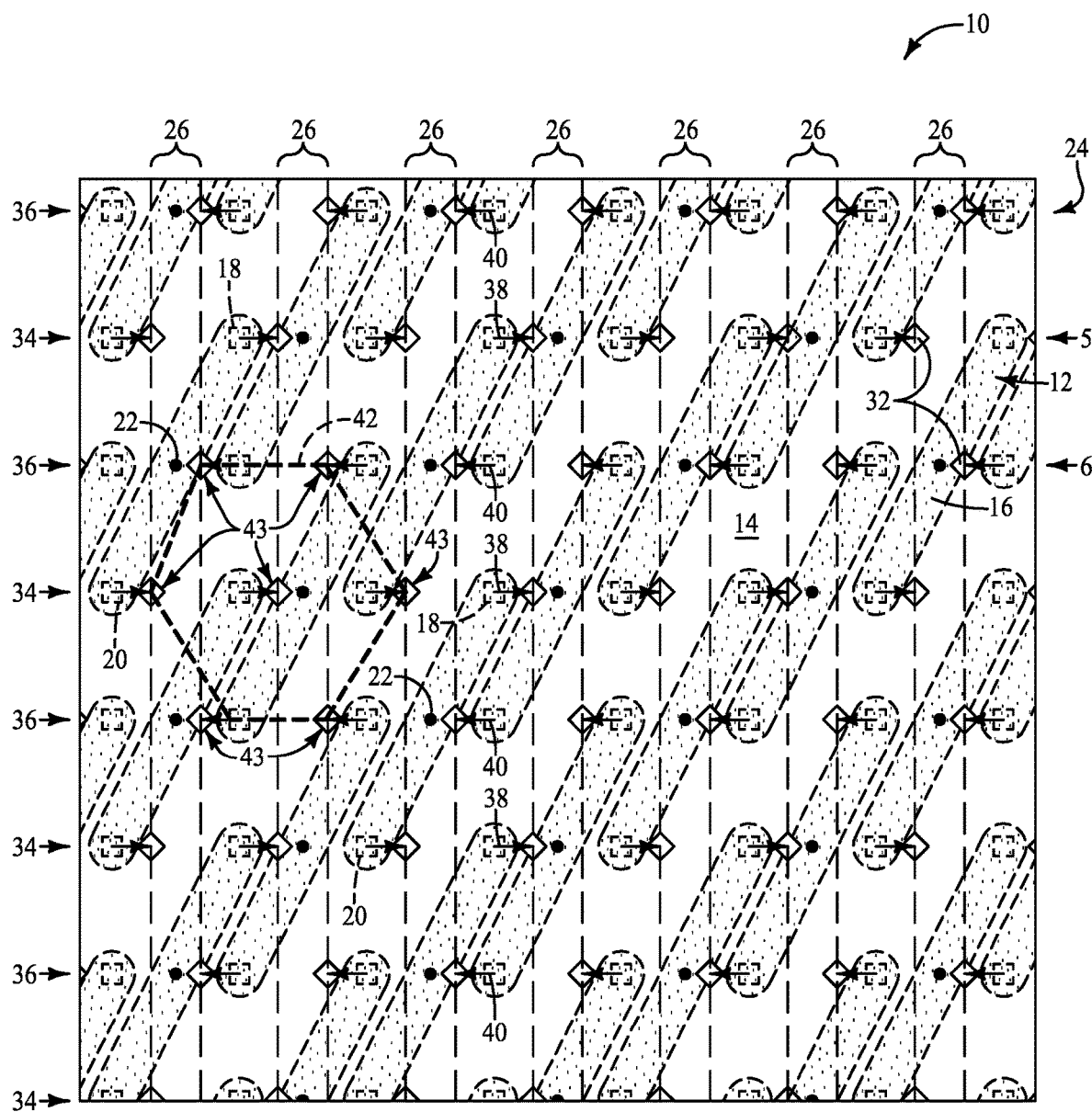
FIG. 2 is a diagrammatic top-down view of an example memory array modified relative to the memory array of FIG. 1.

FIG. 2 shows the assembly 10 after redistribution material 32 is utilized to shift locations for the contacts to the capacitors (storage elements). Upper surfaces of the redistribution material 32 are indicated with diamond-shaped structures.

The wordlines 28 are not shown in FIG. 2 to simplify the drawing.

The capacitor-contact-regions 18, 20 are shown in dashed-line (phantom) view in FIG. 2 to indicate that other materials (e.g., redistribution materials) have been formed over the capacitor-contact-regions. The redistribution material 32 is coupled with the capacitor-contact-regions 18, 20, and extends upwardly and laterally outwardly from such capacitor-contact-regions. The array 24 of the capacitor-contact regions 18, 22 may be considered to comprise alternating first and second rows 34 and 36. The redistribution material 32 along the first rows 34 has a first configuration such that the upper surfaces of the redistribution material 32 are shifted in a first direction 38 relative to the capacitor-contact-regions 18, 20; and the redistribution material 32 along the second rows 36 has a second configuration such that the upper surfaces of the redistribution material 32 are shifted in a second direction 40 relative to the capacitor-contact regions 18, 20. In the illustrated embodiment, the first direction 38 is a rightward direction and the second direction 40 is a leftward direction. The second direction 40 may be considered to be substantially opposite to the first direction 38, with the term "substantially opposite" meaning opposite to within reasonable tolerances of fabrication and measurement.

The upper surfaces of the redistribution material 32 are arranged in a pattern such that seven adjacent upper surfaces of the conductive redistribution material 32 form a unit of a substantially hexagonal-close-packed configuration 42, with one of such units being labeled and identified in FIG. 2. The term "substantially hexagonal-close-packed" means hexagonal-close-packed to within reasonable tolerances of fabrication and measurement. The seven adjacent upper surfaces of the conductive redistribution material utilized in the configuration 42 are labeled as surfaces 43. The hexagonal-close-packing may enable capacitors to be tightly arranged across the underlying active regions 12. In some embodiments, the hexagonal-close-packing may maximize the packing density that may be achieved with some capacitor configurations (e.g., cylindrical configurations).

Figure 3:
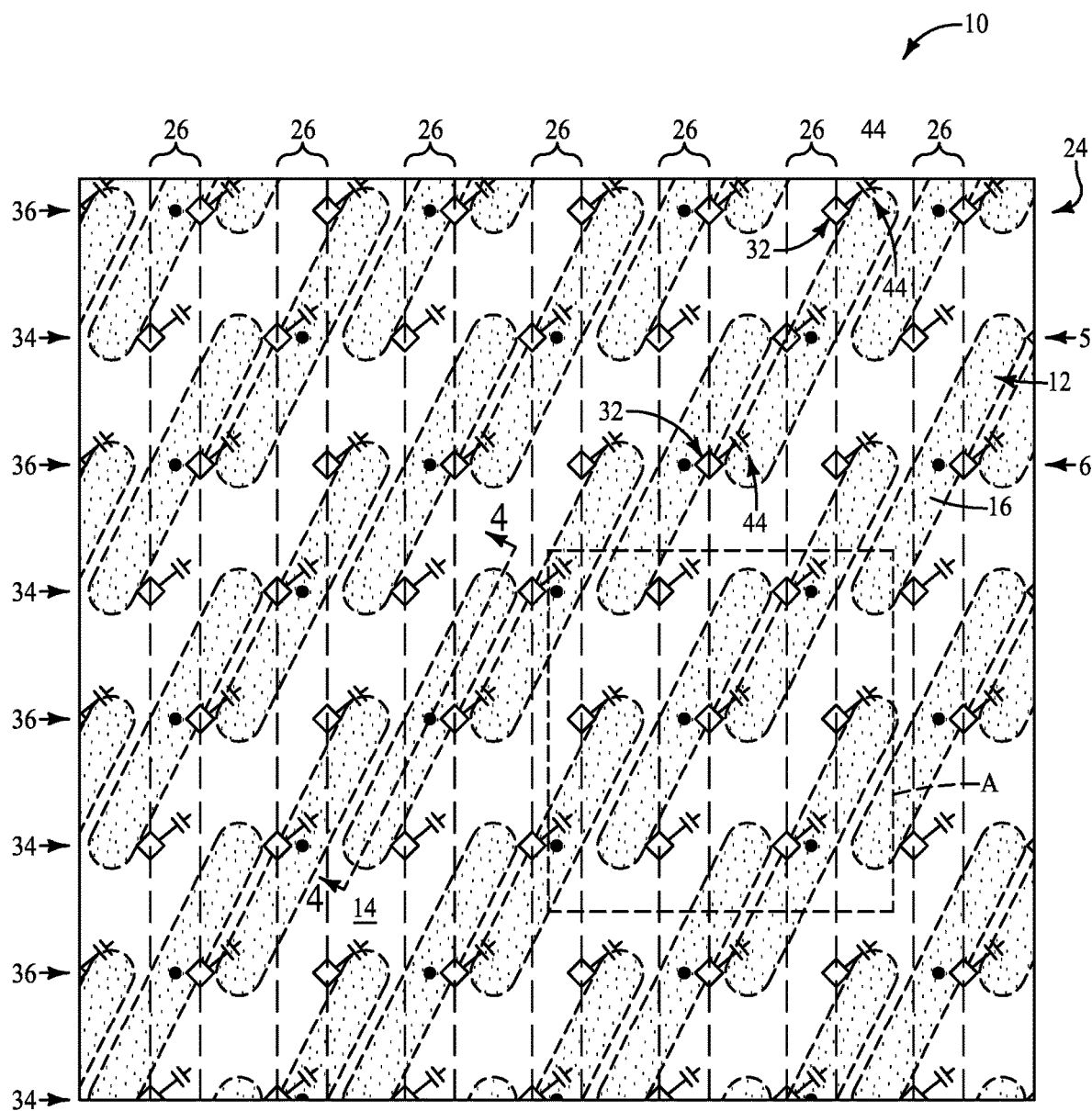
FIG. 3 is another diagrammatic top-down view of the modified memory array of FIG. 2.

FIG. 3 shows the assembly 10 of FIG. 2 without the capacitor-contact-regions (18, 20) and without the shifted directions (38, 40), to simplify the drawing. Capacitors 44 are shown to be electrically coupled with the upper surfaces of the redistribution material 32. The capacitors are arranged in the hexagonal-close-packed configuration described above with reference to the unit 42 of FIG. 2.

Figure 3A:
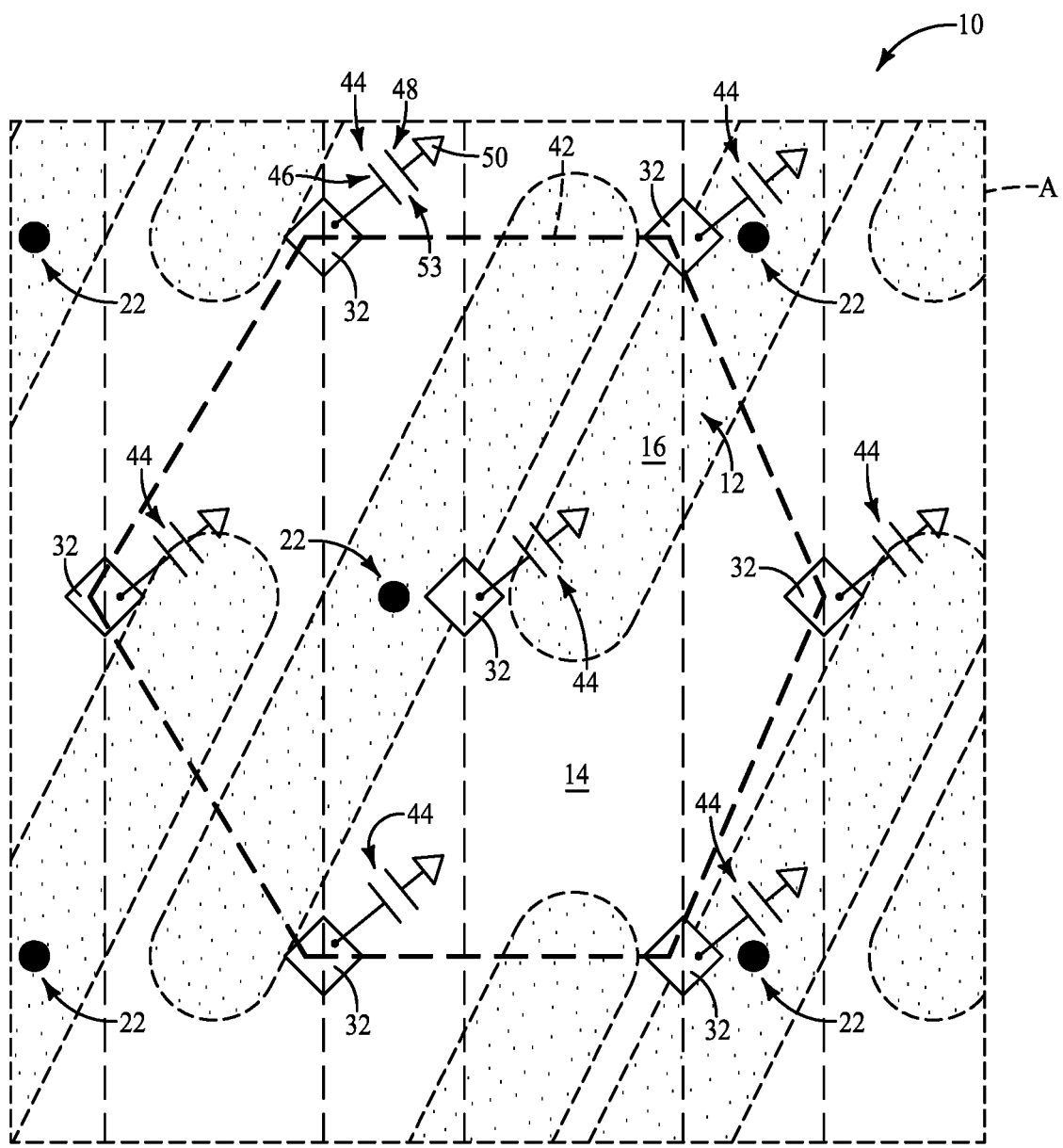
FIG. 3A is an enlarged top-down view of a region labeled "A" in FIG. 3.

FIG. 3A shows an enlarged view of a region "A" of FIG. 3 to assist the reader in visualizing the various features of FIG. 3. The capacitors 44 of FIG. 3A each comprise a pair of electrodes (nodes 46 and 48), with the electrode 46 being coupled to the redistribution material 32, and the electrode 48 being coupled with a reference voltage source 50. The reference voltage source is represented with a triangle. The reference voltage source may be at any suitable reference voltage, including, for example, ground, VCC/2, etc. Capacitor dielectric material 53 is between the electrodes 46 and 48. The capacitors 44 may have any suitable configuration. The capacitors are shown arranged in the hexagonal-close-packed-configuration 42 described above with reference to FIG. 3.

Figure 4:
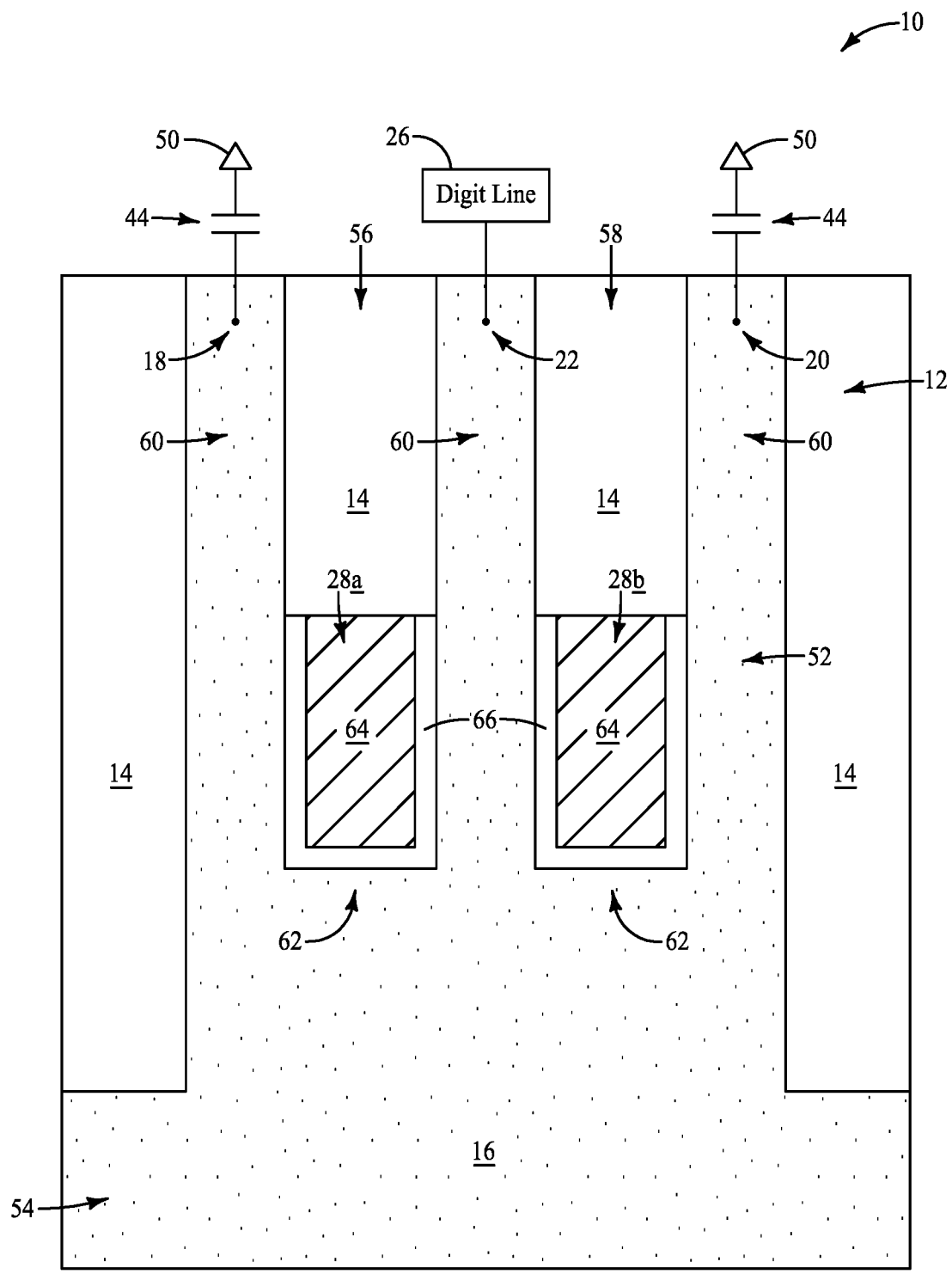
FIG. 4 is a diagrammatic cross-sectional side view along a line 4-4 of FIG. 3.

FIG. 4 shows a section along the line 4-4 of FIG. 3, and shows one of the active regions 12. The active region 12 includes a pillar 52 of the semiconductor material 16, with such pillar extending upwardly from a mass 54 of the semiconductor material. The pillar 52 may be referred to as a semiconductor pillar, or as a semiconductor-material-pillar.

The pillar 52 has two trenches 56 and 58 extending therein. The trenches 56 and 58 may be referred to as a first trench and a second trench, respectively. The digit-line-contact region 22 is within a segment of the pillar 52 between the trenches 56 and 58. The first and second capacitor-contact-regions 18 and 20 are along regions of the semiconductor pillar 52 which are outward of the trenches 56 and 58. The regions 18, 20 and 22 may correspond to conductively-doped source/drain regions 60 within upper portions of the semiconductor pillar 52. Channel regions 62 may be within the semiconductor material 16 along lower surfaces of the trenches 56 and 58.

The capacitor-contact-regions 18 and 20 are coupled with capacitors 44, and the digit-line-contact-region 22 is coupled with a digit line 26. The redistribution material 32 is not shown in FIG. 4 to simplify the drawing.

Wordlines 28a and 28b are within the trenches 56 and 58, respectively. The wordline 28a may be referred to as a first wordline, and the wordline 28b may be referred to as a second wordline. The wordlines 28a and 28b comprise conductive wordline material 64. The wordline material 64 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the wordlines 28a and 28b may comprise metal.

The wordline material 64 is spaced from the semiconductor material 16 of the pillar 52 by insulative material (gate dielectric material) 66. Such insulative material may comprise any suitable composition(s), and in some embodiments may comprise, consist essentially of, or consist of silicon dioxide.

The first wordline 28a gatedly couples the first capacitor-contact-region 18 with the digit-line-contact-region 22, and the second wordline 28b gatedly couples the second capacitor-contact-region 20 with the digit-line-contact-region 22. The term "gated coupling" is utilized to refer to the controlled coupling/decoupling of the source/drain regions (e.g., 20 and 22) that may be induced by electrical activation/deactivation of a wordline 28.

Figure 5:
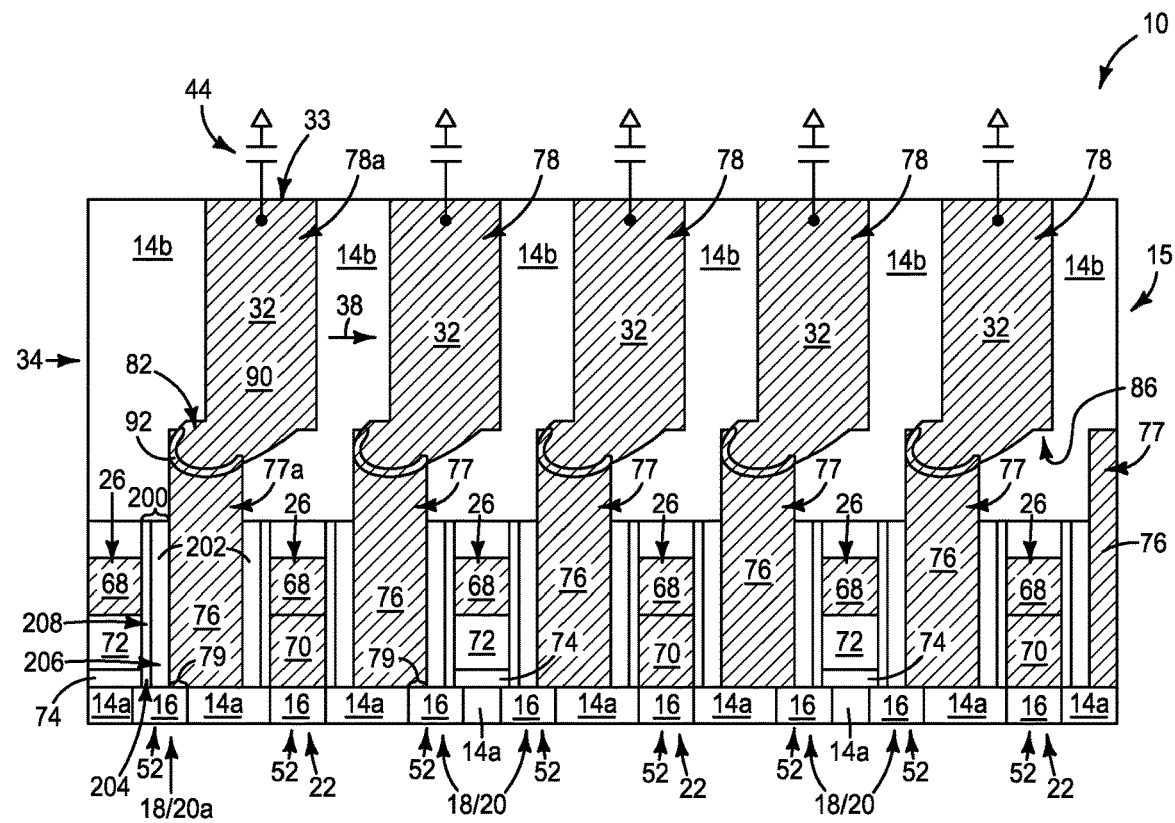
FIGS. 5 and 6 are diagrammatic cross-sectional side views along directions labeled "5" and "6" of FIGS. 2 and 3.
Figure 6:
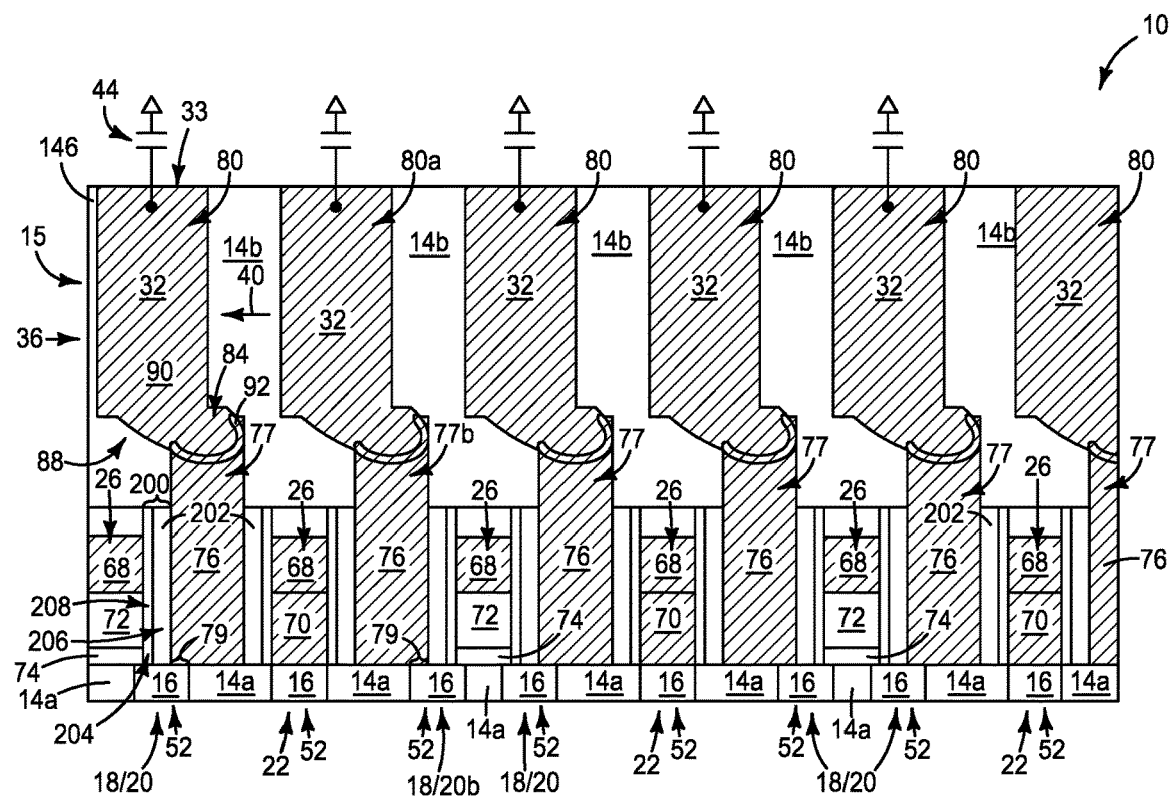

FIGS. 5 and 6 diagrammatically illustrate cross-sections along the directions "5" and "6" of FIGS. 2 and 3, and show example configurations of the redistribution material 32. FIGS. 5 and 6 show upper regions of the semiconductor-material-pillars 52 described above with reference to FIG. 4, and specifically show the capacitor-contact-regions 18/20 and the digit-line-contact regions 22. The regions 18/20 are spaced from the regions 22 by intervening regions comprising the insulative material 14 (labeled 14a in FIGS. 5 and 6). The pillars 52 of FIGS. 5 and 6 would comprise the trenches 58 and channel regions 62 described above with reference to FIG. 4, but such segments of the pillars are not shown in FIGS. 5 and 6 to simplify the drawings.

Digit lines 26 extend in and out of the page relative to the cross-sections of FIGS. 5 and 6. The digit lines 26 comprise conductive digit line material 68. The digit line material 68 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the digit lines 26 may comprise metal.

Some of the digit lines 26 are directly over digit-line-contact-regions 22 along the cross-sections of FIGS. 5 and 6, and such digit lines are electrically coupled to the underlying digit-line-contact-regions 22 through conductive interconnecting material 70. The interconnecting material 70 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the interconnecting material 70 may comprise conductively-doped semiconductor material (e.g., conductively-doped silicon).

Some of the digit lines 26 pass across underlying capacitor-contact-regions 18/20 along the cross-sections of FIGS. 5 and 6. Such digit lines are vertically spaced from the underlying capacitor-contact-regions by insulative materials 72 and 74. The insulative materials 72 and 74 may comprise any suitable composition(s); and may comprise the same composition as one another, or may comprise different compositions relative to one another. In some embodiments, the insulative materials 72 and 74 may comprise one or more of silicon dioxide, silicon nitride, aluminum oxide, etc.

In some embodiments, the digit-line-contact-regions 22 and the capacitor-contact-regions 18/20 may be considered to be arranged in the array 24 described above with reference to FIGS. 2 and 3. Each of the digit-line-contact-regions 22 may be considered to be between a pair of the capacitor-contact-regions 18/20, as shown in FIG. 4. The conductive redistribution material 32 is electrically coupled with the capacitor-contact-regions through conductive interconnecting material 76. The interconnecting material 76 may comprise the same conductive materials described above with reference to the interconnecting material 70. The interconnecting materials 70 and 76 may be referred to as first and second interconnecting materials to distinguish them from one another. The interconnecting materials 70 and 76 may comprise the same composition as one another, or may comprise different compositions relative to one another. In some embodiments, the interconnecting materials 70 and 76 may both comprise, consist essentially of, or consist of conductively-doped semiconductor material (e.g., conductively-doped silicon).

The interconnecting material 76 may be considered to be configured as conductive plugs 77. The conductive plugs 77 have segments 79 (only some of which are labeled) that are directly over underlying capacitor-contact-regions 18/20.

FIG. 5 is a cross-section along one of the first rows 34 of FIGS. 2 and 3, and FIG. 6 is a cross-section along one of the second rows 36 of FIGS. 2 and 3. The conductive redistribution material 32 is configured as first structures 78 along the cross-section of FIG. 5, and is configured as second structures 80 along the cross-section of FIG. 6. The first structures 78 are offset from underlying capacitor-contact-regions 18/20 along the first direction represented by the arrow 38, and the second structures 80 are offset from the underlying capacitor-contact-regions 18/20 along the second direction represented by the arrow 40. For instance, one of the structures 78 of FIG. 5 is identified with the label 78a, and is shown to be electrically coupled with an underlying capacitor-contact-region labeled 18/20a through a conductive plug 77a. The structure 78a extends upwardly and laterally outwardly from the capacitor-contact-region 18/20a and the conductive plug 77a, and is laterally offset from the capacitor-contact-region 18/20a and the conductive plug 77a along the first direction 38. Similarly, one of the structures 80 of FIG. 6 is identified with the label 80a and is shown to be electrically coupled with an underlying capacitor-contact-region labeled 18/20b through a conductive plug 77b. The structure 80a extends upwardly and laterally outwardly from the underlying capacitor-contact-region 18/20b and the conductive plug 77b, and is laterally offset from the underlying capacitor-contact-region 18/20b and the conductive plug 77b along the second direction 40.

In some embodiments, the first direction 38 may be considered to be substantially along the first row 34 of FIG. 5, and the second direction 40 may be considered to be substantially along the second row 36 of FIG. 6. The term "substantially along" means "coextensive with" to within reasonable tolerances of fabrication and measurement. The second direction 40 is substantially opposite to the first direction 38, with the term "substantially opposite" meaning opposite to within reasonable tolerances of fabrication and measurement.

The conductive redistribution material 32 of FIGS. 5 and 6 has upper surfaces 33, and the capacitors 44 are electrically coupled with such upper surfaces.

In the illustrated embodiment, the structures 78 and 80 of the conductive redistribution material 32 are boot-shaped structures along the cross-sections of FIGS. 5 and 6. The structures 78 may be referred to as first boot-shaped structures, and the structures 80 may be referred to as second boot-shaped structures. Each of the first boot-shaped structures 78 has a toe region 82 extending into an associated conductive plug 77, and similarly each of the second boot-shaped structures 80 has a toe region 84 extending into an associated conductive plug 77. Also, each of the first boot-shaped structures 78 has a heel region 86 directly over a portion of a digit line 26, and each of the second boot-shaped structures 80 has a heel region 88 directly over a portion of a digit line 26. In some embodiments, the heel regions of the structures 78 and 80 may be considered to be above the digit lines 26, and to partially overlap (i.e., partially laterally overlap) the digit lines.

The illustrated boot-shaped structures 78 and 80 each comprises a first material 90 and a second material 92, with such first and second materials 90 and 92 together being the redistribution material 32. The materials 90 and 92 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the material 90 is a composition containing one or more metals. For instance, the material 90 may comprise, consist essentially of, or consist of one or both of tungsten and titanium. In some embodiments, the material 92 comprises metal silicide. For instance, the material 92 may comprise, consist essentially of, or consist of one or more of CoSi, WSi and TiSi, where the chemical formulas indicate primary constituents rather than specific stoichiometries. In some embodiments, the material 92 may be referred to as comprising, consisting essentially of, or consisting of one or more of cobalt silicide, tungsten silicide and titanium silicide.

The first boot-shaped structures 78 are substantially mirror images of the second-shaped structures 80, with the term "substantial mirror image" meaning a mirror image to within reasonable tolerances of fabrication and measurement.

Insulative material 14b (e.g., silicon nitride, silicon dioxide, etc.) is laterally between the structures 78 along the cross-section of FIG. 5, and is laterally between the structures 80 along the cross-section of FIG. 6. In some embodiments, the insulative material 14b may be considered to be configured as an insulative mass 15 which is over the digit lines 26 and the conductive plugs 77. The structures 78 and 80 may be considered to extend downwardly through the insulative mass 15 and into the conductive plugs 77. In some embodiments, the insulative material 14b may be the same as the insulative material 14a (e.g., both may comprise, consist essentially of, or consist of silicon dioxide). In other embodiments, the insulative material 14b may be different than the insulative material 14a. For instance, in some embodiments the insulative material 14b may comprise, consist essentially of, or consist of silicon nitride, while the insulative material 14a comprises silicon dioxide.

In the illustrated embodiment, insulative regions 200 (only some of which are labeled) are adjacent the conductive plugs 77, and space the conductive plugs from the digit lines 26. The insulative regions 200 are shown to comprise two portions 206 and 208. The portions 206 may be referred to as insulative structures, beams, rails, etc., and comprise an insulative material 202. The material 202 may comprise any suitable composition(s), such as, for example, silicon nitride. The portions 208 may comprise one or both of voids and low-k dielectric material (with the term "low-k" meaning a dielectric constant less than that of silicon dioxide, and specifically less than about 3.7). The portions 208 are shown to have regions 204 therein. If the portions 208 are voids, the regions 204 may be gas-filled voids (e.g., may be voids filled with one or more of air, nitrogen, argon, etc.), and if the portions comprise low-k dielectric material, the regions 204 may be filled may be with one or more of porous silicon dioxide, carbon-doped silicon dioxide, boron-doped silicon dioxide, etc.

Although the example embodiment of FIGS. 5 and 6 shows the insulative regions 200 comprising two separate portions 206 and 208, in other example embodiments the insulative regions may comprise more than two separate portions or only a single homogeneous configuration. An example embodiment in which the insulative regions 200 comprise single homogeneous configurations is described below with reference to FIGS. 31 and 32.

Some of the portions 208 comprising the voids and/or the low-k dielectric material directly contact upper surfaces of the capacitor-contact-regions 18/20 in the shown embodiment.

The configurations of FIGS. 2-6 may be formed with any suitable methods. An example method is described with reference to FIGS. 7-22.

Figure 7:
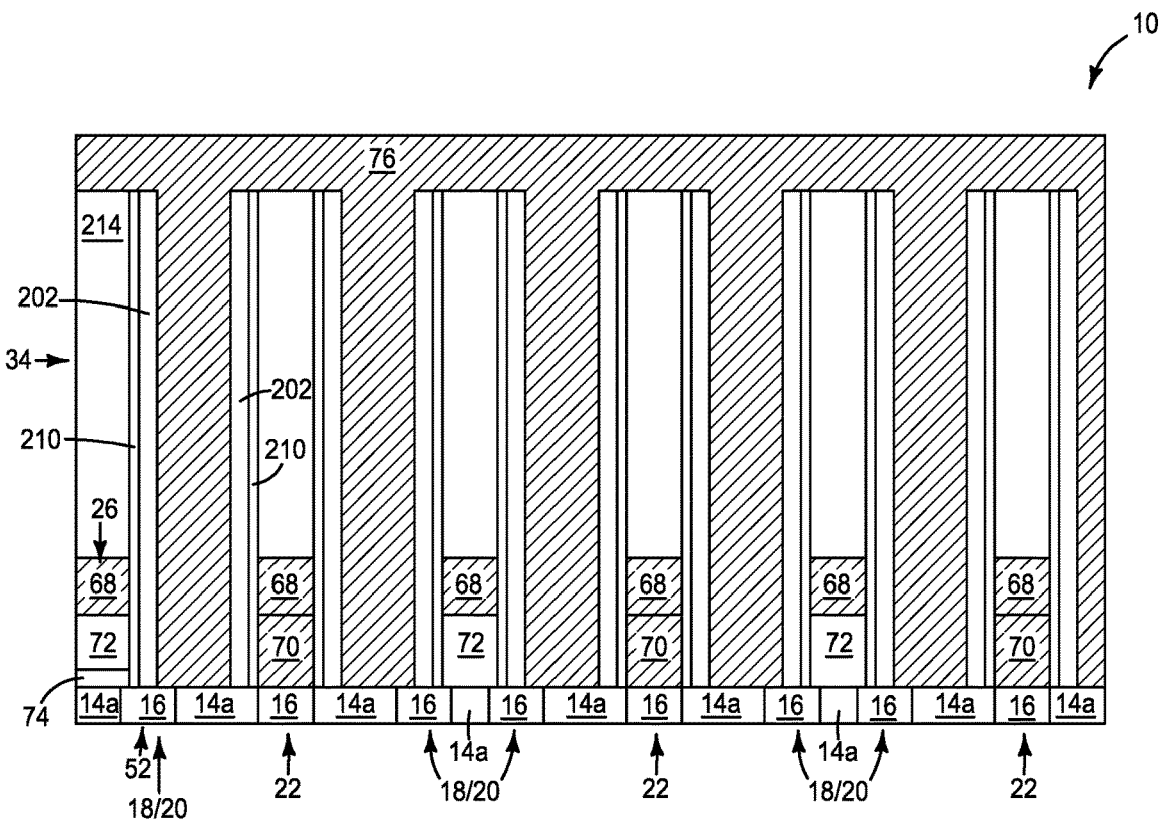
FIGS. 7 and 8 are diagrammatic cross-sectional side views along the same cross-sections as FIGS. 5 and 6 at an example process stage of an example method.
Figure 8:
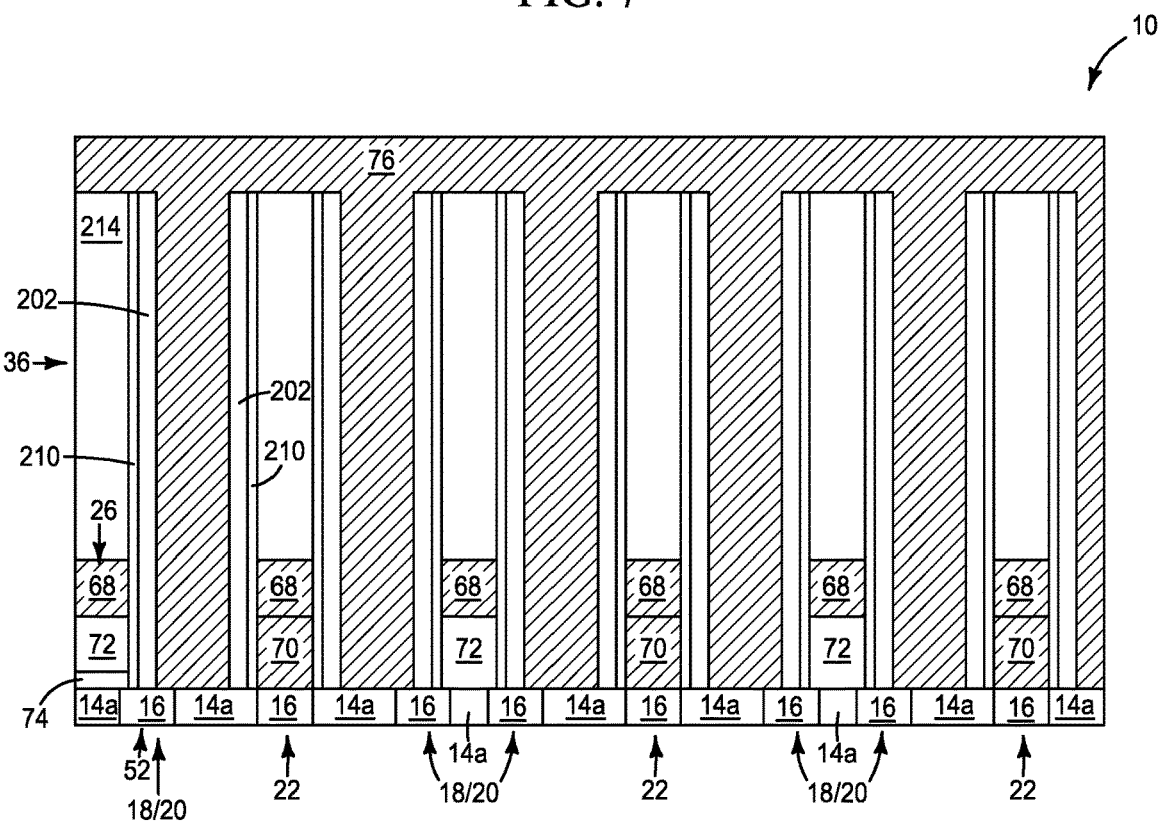

Referring to FIGS. 7 and 8, the assembly 10 is shown along the rows 34 and 36, respectively. The region of the assembly 10 of FIGS. 7 and 8 may be considered to be a construction which is formed to have the semiconductor-material-pillars 52 (analogous to the pillars 52 of FIG. 4). The pillars 52 comprise the digit-line-contact regions 22 and the capacitor-contact-regions 18/20. The regions 22 and 18/20 may be within an array analogous to the array 24 of FIGS. 2 and 3. Such array has the alternating first and second rows 34 and 36. The capacitor-contact-regions 18/20 are spaced from the digit-line-contact-regions 22 along such rows by the insulative material 14a.

The construction of FIGS. 7 and 8 includes the digit lines 26, with some of the digit lines being directly over the digit-line-contact-regions 22 along the cross-sections of FIGS. 7 and 8.

The construction of FIGS. 7 and 8 also includes an insulative material 214 over the digit lines 26, and includes the conductive plug material 76 contacting the capacitor-contact-regions 18/20 and extending over the insulative material 214. The insulative material 214 may comprise any suitable composition(s), and in some embodiments may comprise, consist essentially of, or consist of silicon nitride. The insulative material 214 may be the same composition as the insulative material 14b of FIGS. 5 and 6.

Materials 202 and 210 are laterally between the materials 76 and 214. The material 202 may comprise silicon nitride, as discussed above with reference to FIGS. 5 and 6. The material 210 is a sacrificial material and may comprise any suitable composition(s). In some embodiments, the material 210 may comprise, consist essentially of, or consist of silicon dioxide. In such embodiments, protective material (passivation material) may be provided between the oxide 210 and the conductive material 68 of the digit lines 26 to avoid undesired oxidation of the digit lines. In some embodiments, the sacrificial material 210 may comprise, consist essentially of, or consist of carbon, metal, etc.

Figure 9:
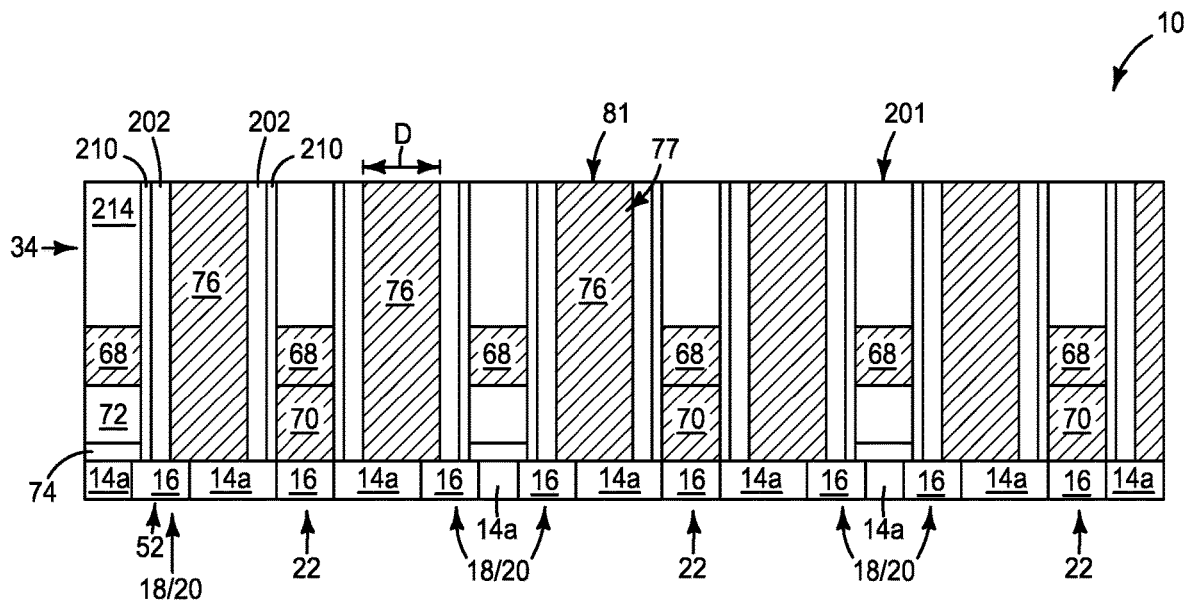
FIGS. 9 and 10 are diagrammatic cross-sectional side views along the same cross-sections as FIGS. 7 and 8 at an example process stage subsequent to that of FIGS. 7 and 8.

Referring to FIGS. 8 and 9, a planarized surface 201 is formed to extend across the materials 214, 76, 202 and 210. The planarized surface may be formed with any suitable processing, including, for example, chemical-mechanical polishing (CMP).

The formation of the planarized surface 201 patterns the conductive material 76 into the conductive plugs 77. The conductive plugs 77 have lateral dimensions corresponding to a dimension D along the cross-sections of FIGS. 9 and 10. The dimension D may be any suitable dimension, and in some embodiments may be within a range of from about 10 nanometers (nm) to about 300 nm. The conductive plugs 77 may be considered to have upper surfaces 81 along the cross-sections of FIGS. 9 and 10, with such upper surfaces having first dimensions corresponding to the dimension D.

Figure 10:
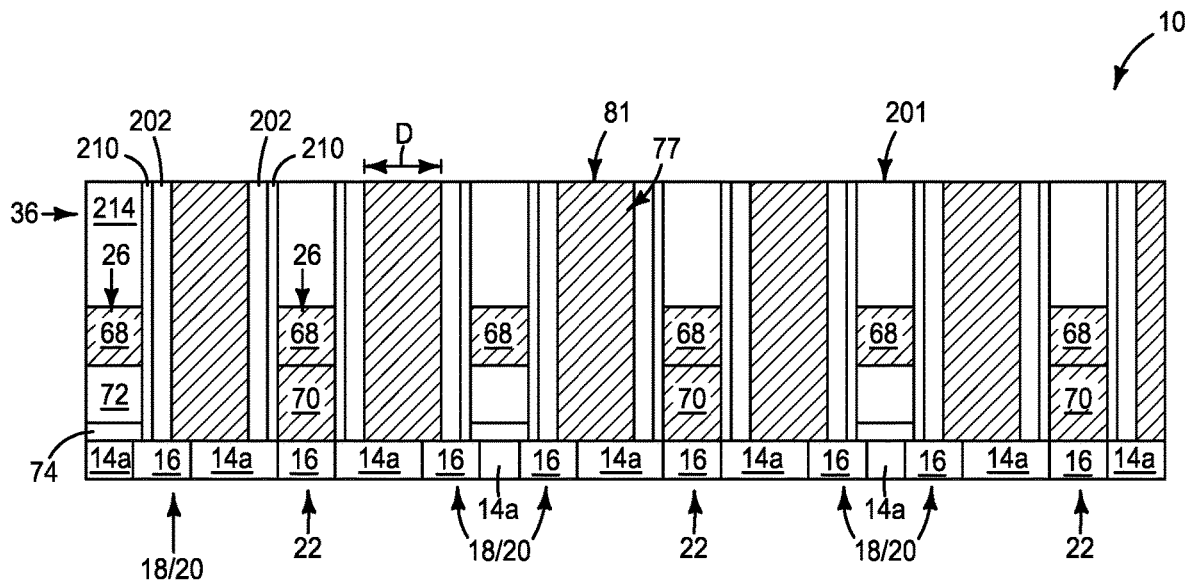

In some embodiments, the cross-sections of FIGS. 9 and 10 may be considered to be first and second cross-sections through the assembly 10; with the first cross-section of FIG. 9 being along one of the first rows 34, and the second cross-section of FIG. 10 being along one of the second rows 36.

Figure 11:
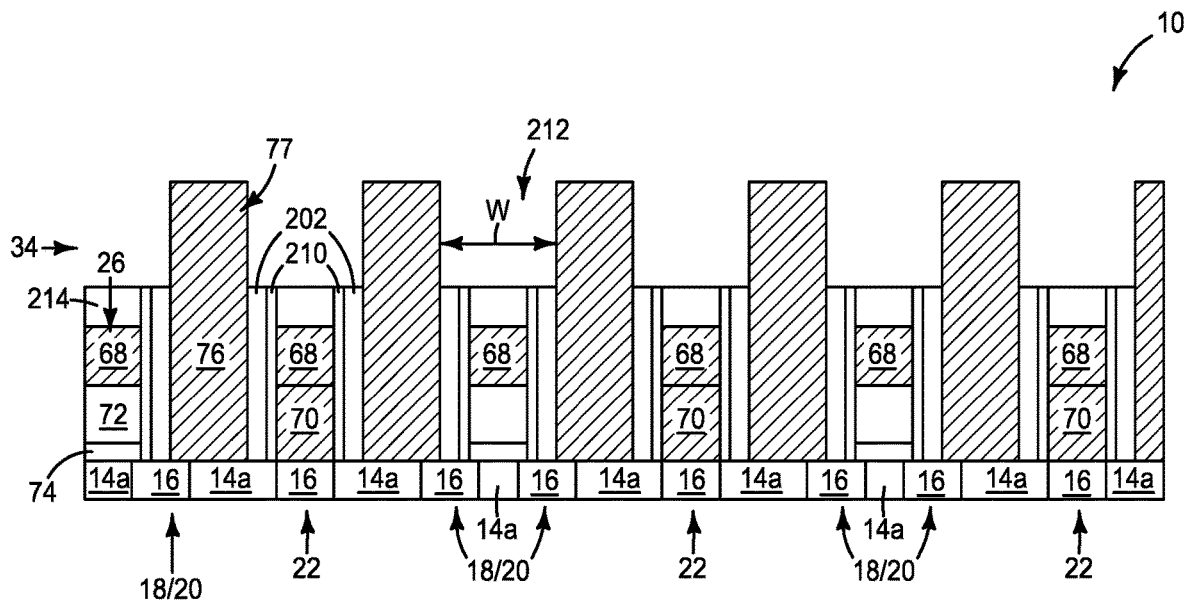
FIGS. 11 and 12 are diagrammatic cross-sectional side views along the same cross-sections as FIGS. 7 and 8 at an example process stage subsequent to that of FIGS. 9 and 10.
Figure 12:
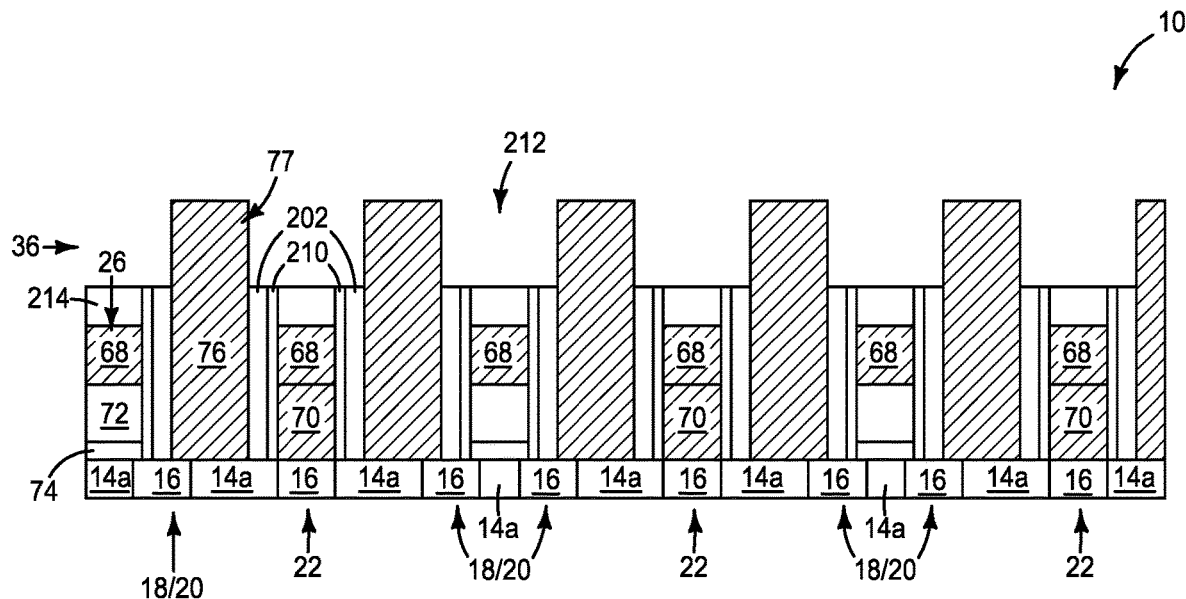

Referring to FIGS. 11 and 12, the materials 214, 202 and 210 are recessed relative to the conductive plugs 77 to form cavities 212 adjacent to upper regions of the conductive plugs. The sacrificial material 210 is exposed along bottom surfaces of the cavities 212.

The cavities 212 of FIGS. 11 and 12 may have any suitable lateral width W along the cross-sections of FIGS. 11 and 12, and in some embodiments such lateral width may be within a range of from about 15 nm to about 30 nm.

The assembly 10 of FIGS. 11 and 12 may be considered to be a construction having the sacrificial material 210 between the digit lines 26 and the conductive plugs 77.

Figure 13:
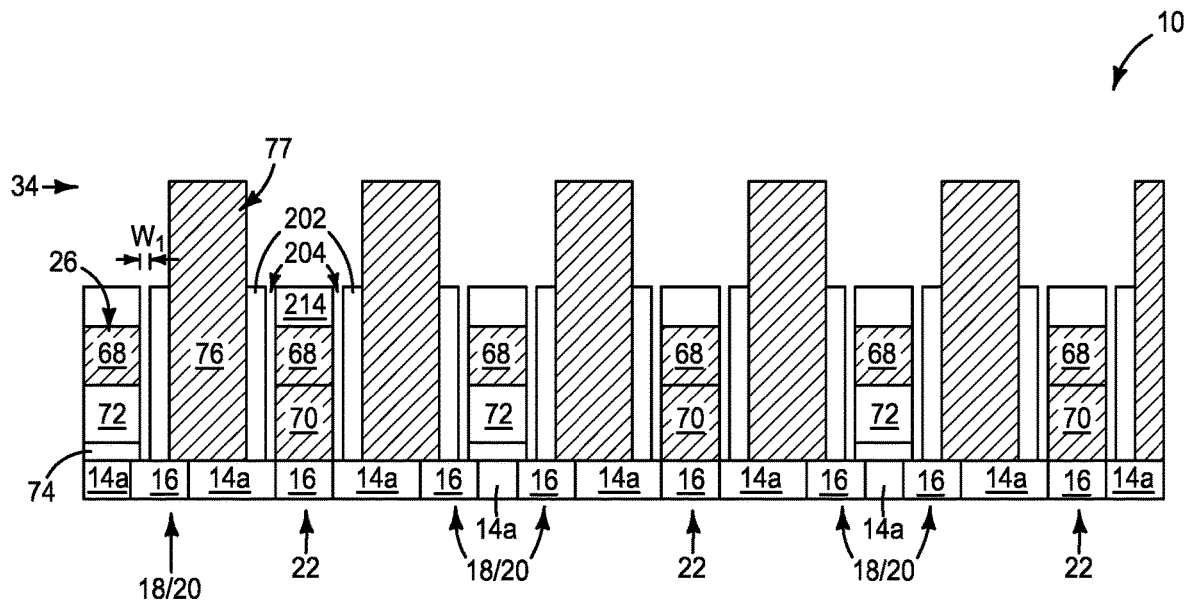
FIGS. 13 and 14 are diagrammatic cross-sectional side views along the same cross-sections as FIGS. 7 and 8 at an example process stage subsequent to that of FIGS. 11 and 12.
Figure 14:
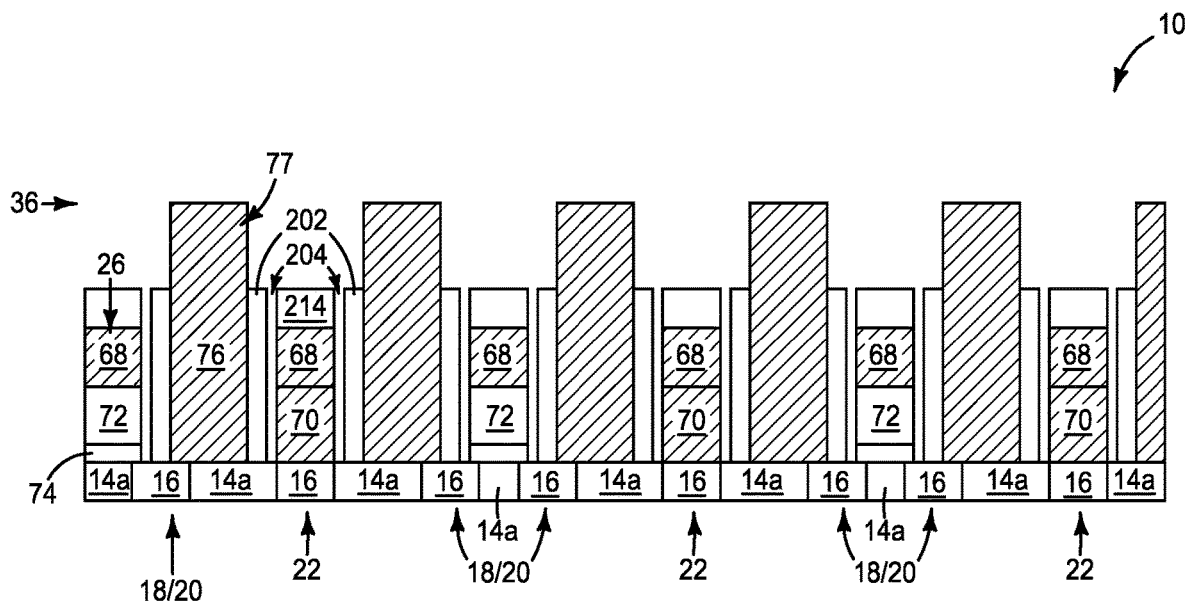

Referring to FIGS. 13 and 14, the sacrificial material 210 (FIGS. 11 and 12) is removed to form void regions (voids) 204. In embodiments in which the sacrificial material 210 comprises silicon dioxide, such removal may utilize etchant comprising hydrofluoric acid.

The void regions 204 of FIGS. 13 and 14 may have any suitable lateral width $W_1$, and in some embodiments such lateral width may be within a range of from about 3 nm to about 10 nm.

Figure 15:
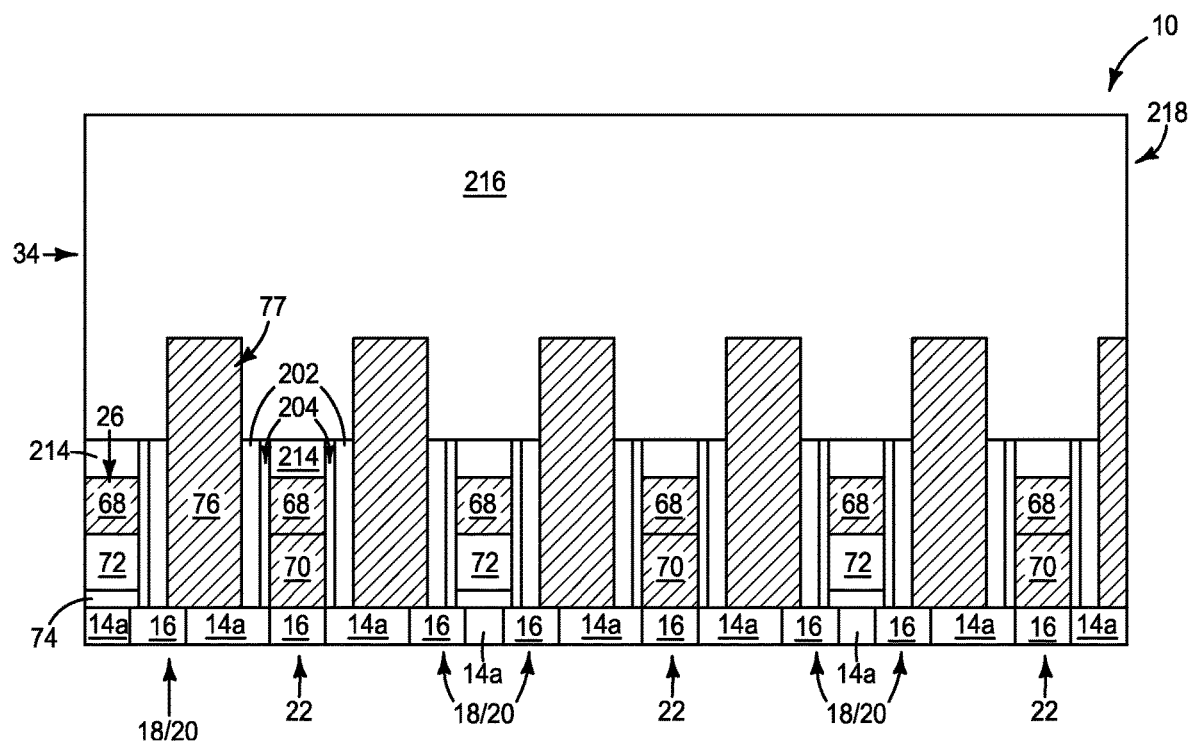
FIGS. 15 and 16 are diagrammatic cross-sectional side views along the same cross-sections as FIGS. 7 and 8 at an example process stage subsequent to that of FIGS. 13 and 14.
Figure 16:
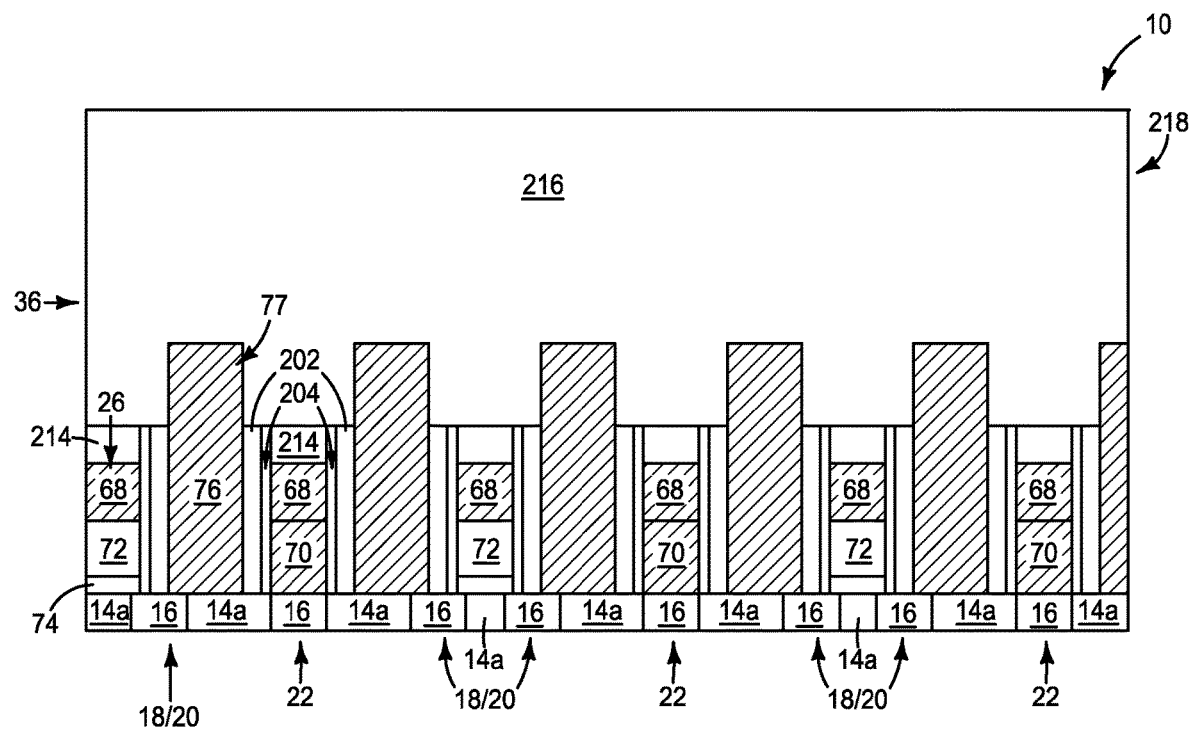

Referring to FIGS. 15 and 16, an insulative mass 218 is formed over the conductive plugs 77 and the voids. The insulative mass 218 seals the voids.

The insulative mass 218 comprises an insulative material 216. The insulative material 216 may comprise any suitable composition(s), and in some embodiments may comprise, consist essentially of, or consist of silicon nitride. The insulative material 216 may be the same composition as the insulative material 14b of FIGS. 5 and 6.

Figure 17:
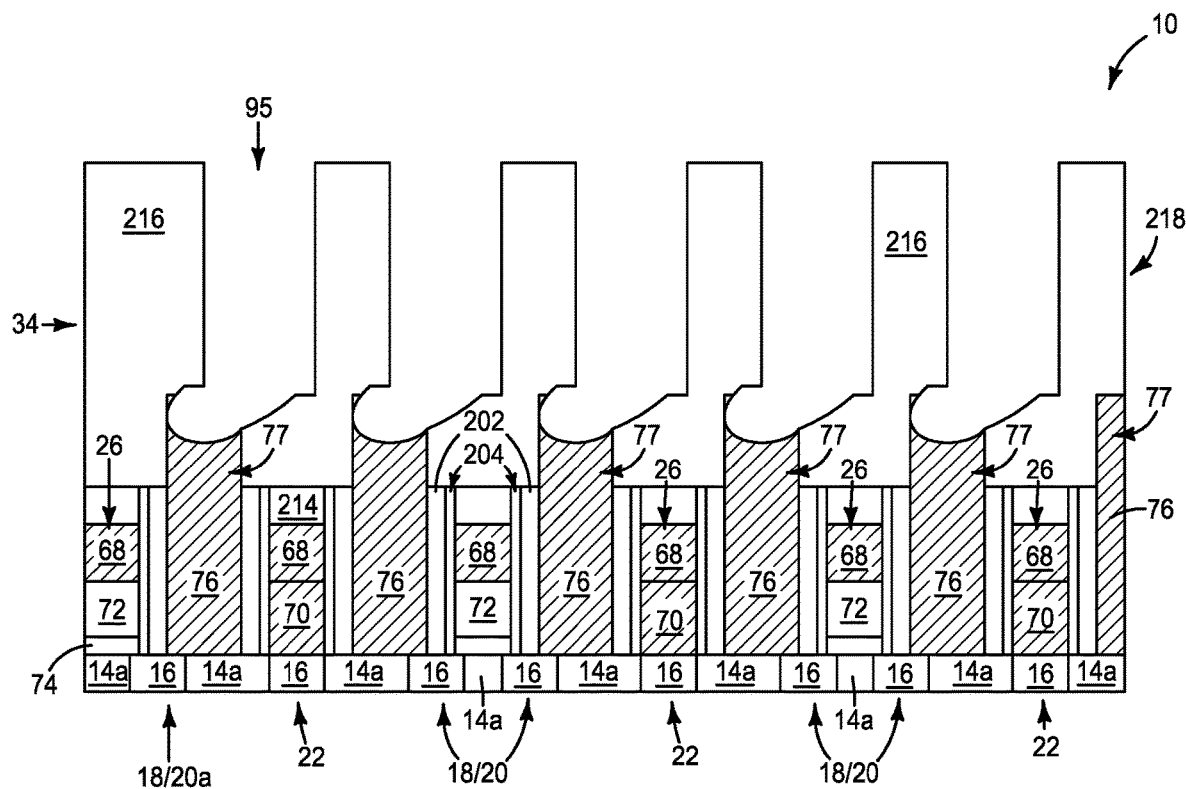
FIGS. 17 and 18 are diagrammatic cross-sectional side views along the same cross-sections as FIGS. 7 and 8 at an example process stage subsequent to that of FIGS. 15 and 16.
Figure 18:
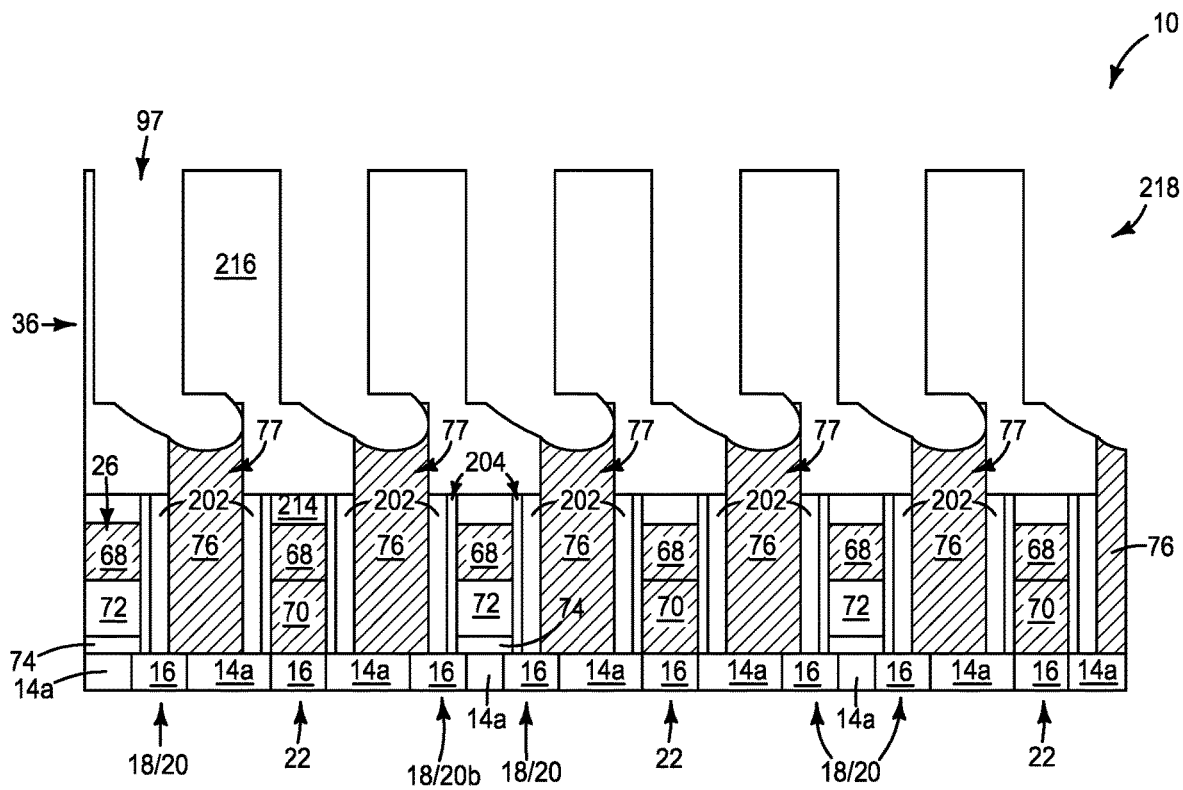

Referring to FIGS. 17 and 18, openings 95 and 97 are formed to extend through the mass 218 and into the conductive plugs 77; with the openings 95 and 97 being along the cross-sections of FIGS. 17 and 18, respectively. In some embodiments, the openings 95 may be referred to as first openings, and the openings 97 may be referred to as second openings.

The openings 95 and 97 may be formed with any suitable processing. For instance, a patterned mask (not shown) may be utilized to define locations of the openings, and then the openings may be formed with a multistep etching process. The multistep etching process may utilize, for example, one or more anisotropic etches to penetrated through the mass 218 and partially into the plugs 77, followed by isotropic etching to extend sideways into the plugs 77.

The first and second openings 95 and 97 may be considered to have first and second shapes, respectively, at the process stage of FIGS. 17 and 18. The second shape of the openings 97 is substantially a mirror image of the first shape of the openings 95. In the illustrated embodiment, the first and second shapes of the openings 95 and 97 are boot shapes, with toes of the boots extending into the conductive plugs 77.

Figure 19:
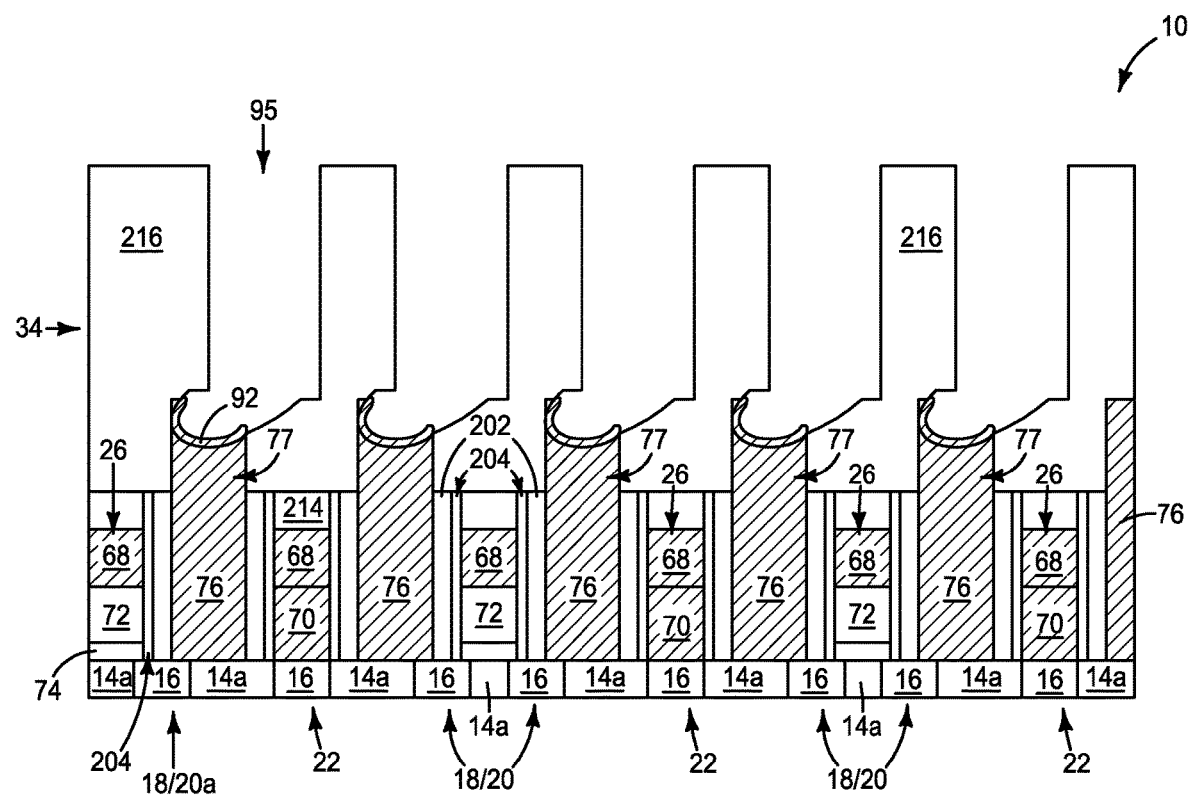
FIGS. 19 and 20 are diagrammatic cross-sectional side views along the same cross-sections as FIGS. 7 and 8 at an example process stage subsequent to that of FIGS. 17 and 18.
Figure 20:
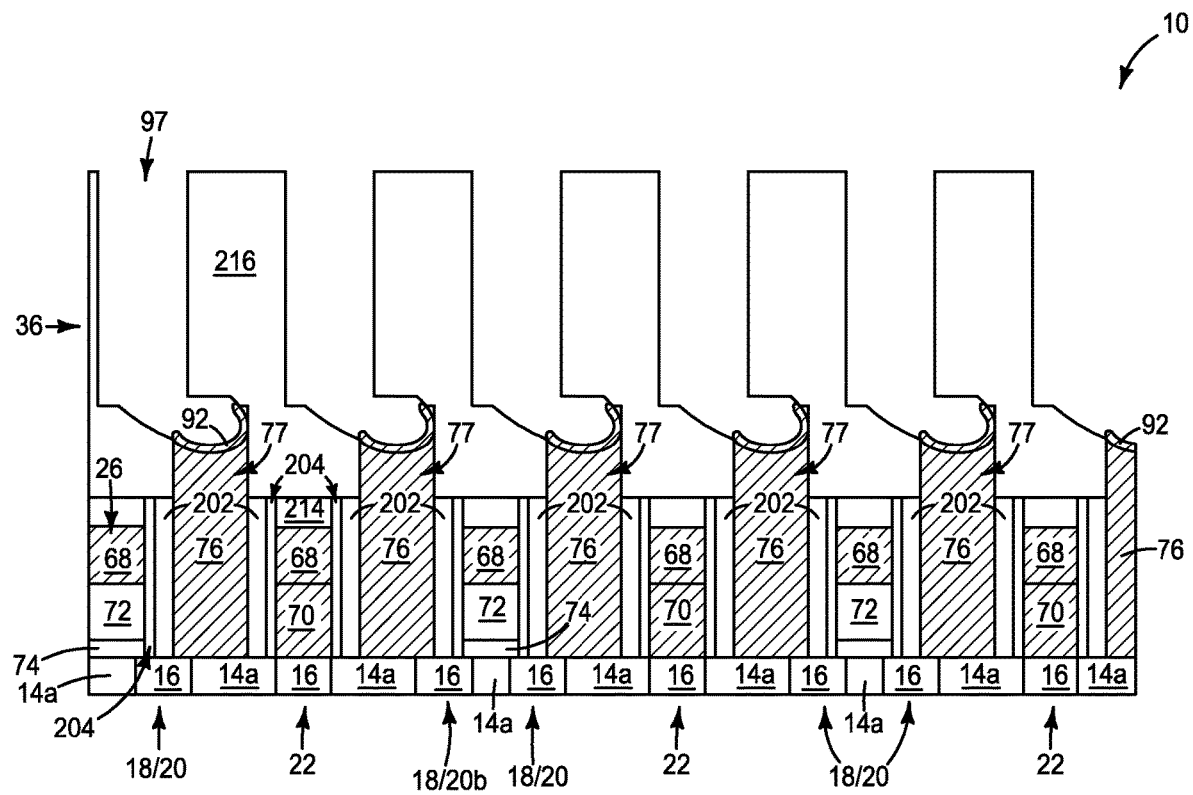

Referring to FIGS. 19 and 20, metal silicide 92 is formed along exposed upper surfaces of the conductive material 76 of the plugs 77. In some embodiments, the conductive material 76 may comprise conductively-doped silicon, and the metal silicide 92 may be formed by appropriate reaction of one or more metals with the silicon of the material 76. Alternatively, or additionally, the metal silicide 92 may be formed using, for example, one or more of atomic layer deposition, chemical vapor deposition and physical vapor deposition. The metal silicide 92 may comprise any suitable composition(s); and in some embodiments may comprise, consist essentially of, or consist of one or more of cobalt silicide, tungsten silicide and titanium silicide.

Figure 21:
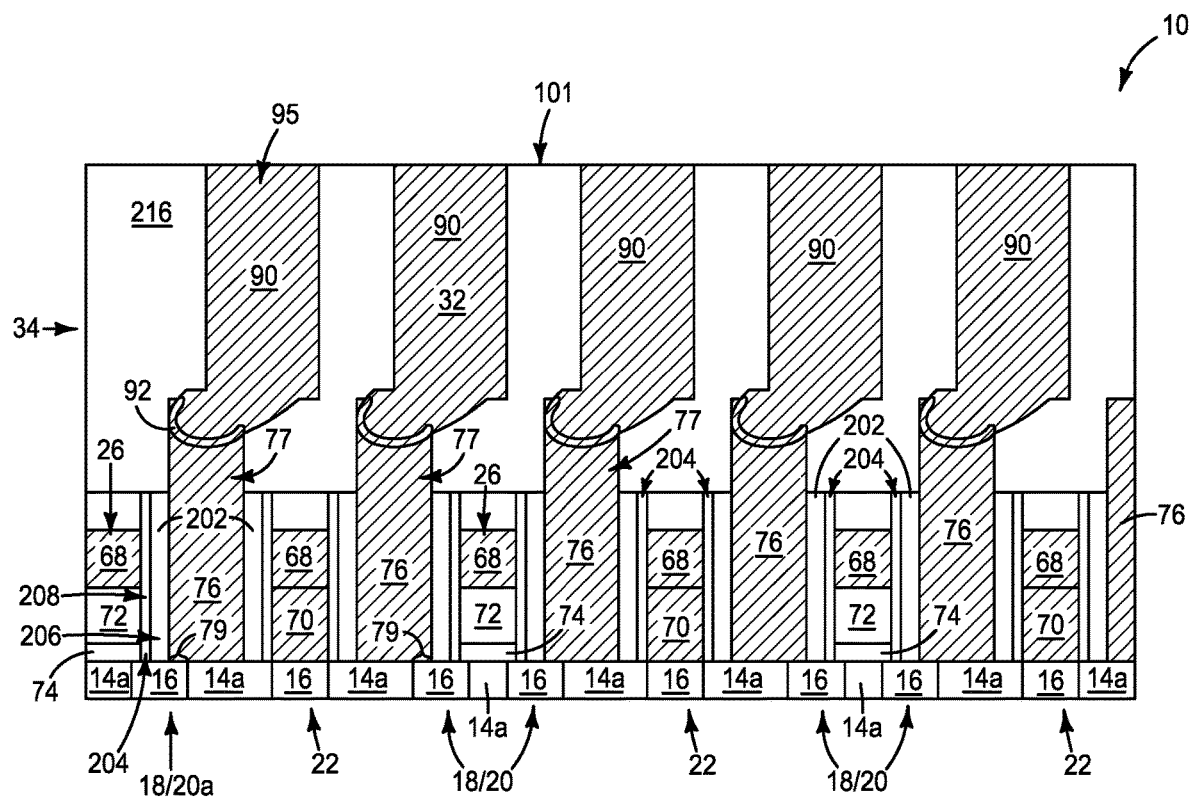
FIGS. 21 and 22 are diagrammatic cross-sectional side views along the same cross-sections as FIGS. 7 and 8 at an example process stage subsequent to that of FIGS. 19 and 20.
Figure 22:
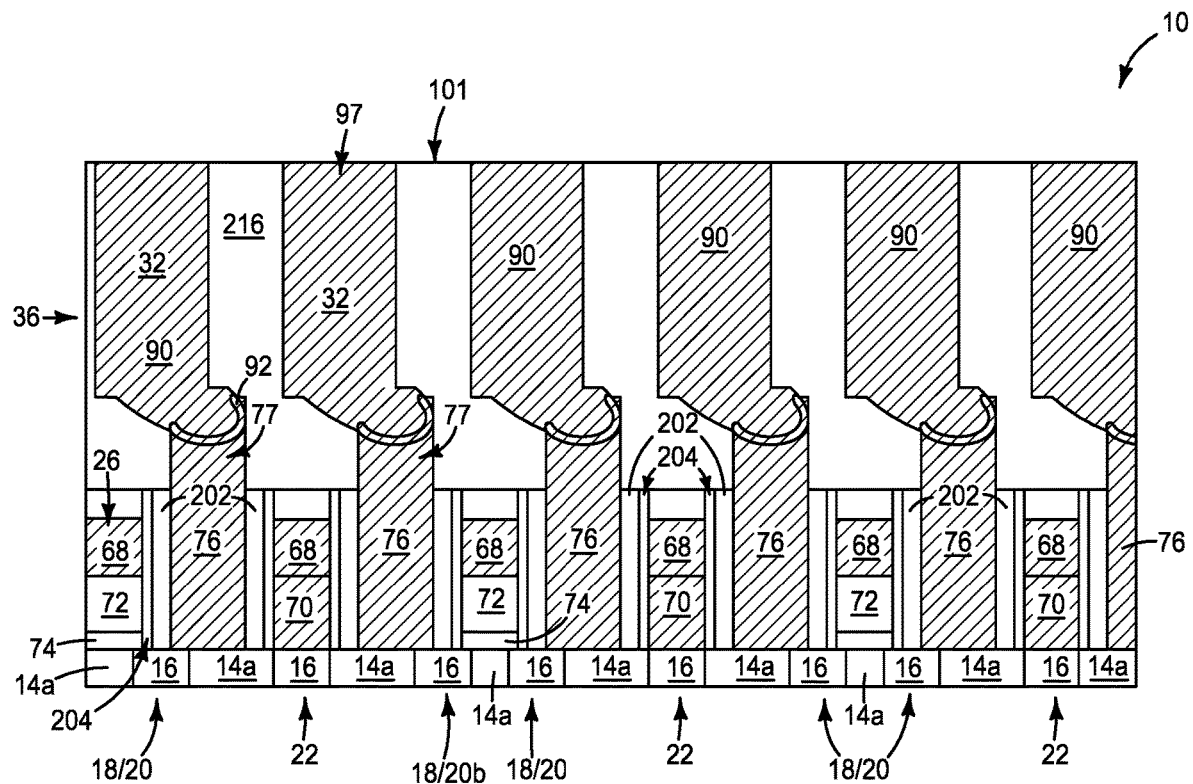

Referring to FIGS. 21 and 22, the conductive material 90 is formed within the openings 95 and 97 to fill such openings. In some embodiments, the conductive material 90 may comprise, consist essentially of, or consist of one or both of titanium and tungsten.

In the illustrated embodiment, a planarized surface 101 extends across the conductive material 90 within the openings 95 and 97, and extends across upper surfaces of the insulative material 216. The planarized surface 101 may be formed with any suitable processing, including, for example, CMP.

The materials 90 and 92 together form the redistribution material 32. Accordingly, the redistribution material 32 may be considered to be formed within the openings 95 and 97 utilizing the process stages of FIGS. 15-22.

In subsequent processing, capacitors may be formed over the surface 101 and coupled with the redistribution material 32 to form the integrated assembly described above with reference to FIGS. 5 and 6. The capacitors may be substantially arranged in a hexagonal-close-packed-configuration 42 of the type shown in FIG. 3A.

The redistribution configurations described above (i.e., the configurations comprising the redistribution material 32) may be utilized to shift capacitor-contact-regions in any suitable direction by any suitable amount. Although the embodiments presented herein utilize the redistribution structures to shift capacitor-contact-regions in opposing directions along the rows 34 and 36, and to shift the capacitor-contact-regions to about equal amounts along each of such opposing directions, in other embodiments the redistribution structures may be utilized to shift the capacitor-contact-regions in other directions, or by other amounts. For instance, the capacitor-contact-regions may be shifted by a different amount along the rows 34 than along the rows 36 in example embodiments alternative to those specifically shown in the figures provided herewith.

Another example method is described with reference to FIGS. 23-32.

Figure 23:
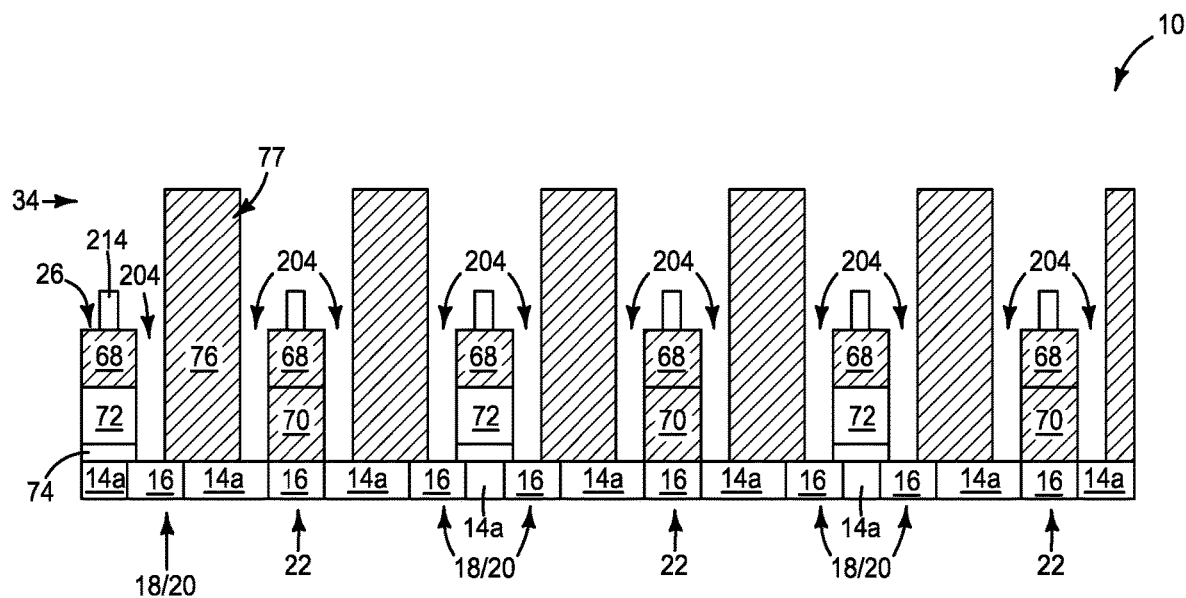
FIGS. 23 and 24 are diagrammatic cross-sectional side views along the same cross-sections as FIGS. 13 and 14 at an example process stage subsequent to that of FIGS. 13 and 14 in accordance with another example embodiment.
Figure 24:
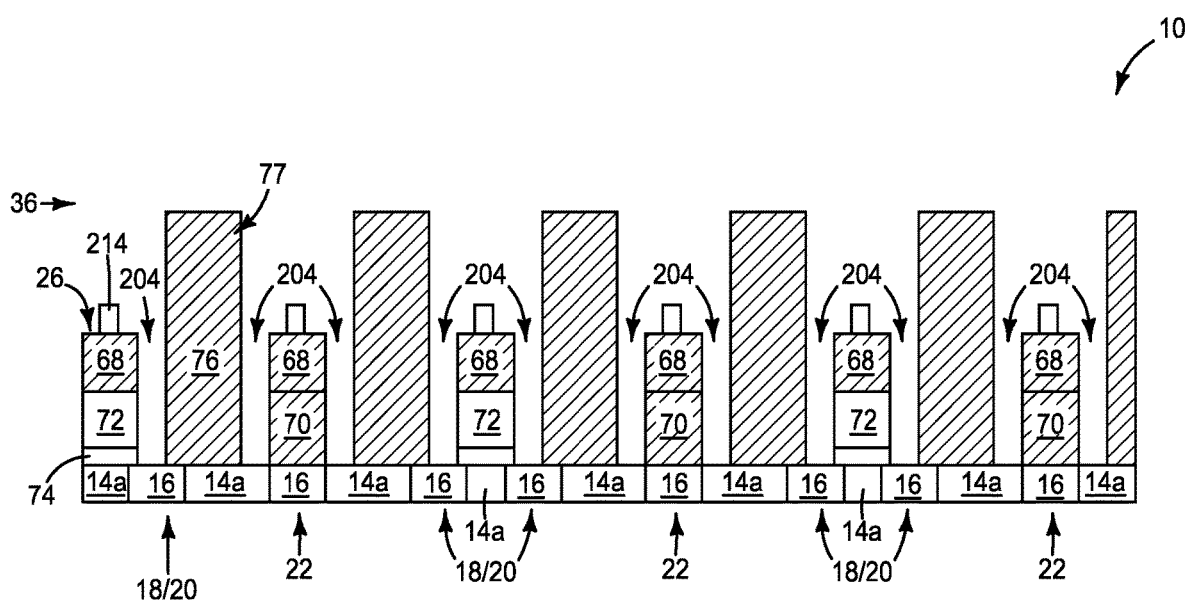

FIGS. 23 and 24 show the assembly 10 at a process stage which may follow that of FIGS. 13 and 14. The material 202 (FIGS. 13 and 14) is removed to laterally extend the void regions 204. In some embodiments, the material 202 may comprise silicon nitride, and may be removed with an etch utilizing phosphoric acid. The material 202 may be referred to as a second sacrificial material to distinguish it from the first sacrificial material 210 of FIGS. 11 and 12.

The void regions 204 of FIGS. 23 and 24 extend laterally from the digit lines 26 to the conductive plugs 77. In the illustrated embodiment of FIGS. 13, 14, 23 and 24, such void regions are formed by first removing a first sacrificial material (210) of FIGS. 11 and 12, and subsequently removing a second sacrificial material (202) of FIGS. 11 and 12. In other embodiments, the sacrificial material 202 may be omitted so that the material 210 entirely fills the spaces between the conductive plugs 77 and the digit lines 26 at the process stage of FIGS. 11 and 12, and thus the void regions 204 of FIGS. 23 and 24 may be formed by simply removing the material 210.

In the illustrated embodiment, the insulative material 214 on top of the digit lines 26 is laterally thinned by the conditions utilized to remove the material 202. In some embodiments, the materials 202 and 214 may both comprise silicon nitride, and accordingly the material 214 may be thinned by the conditions utilized to remove the material 202. A height of the material 214 may be reduced during such etching, even though such reduction is not specifically shown in FIGS. 23 and 24.

Figure 25:
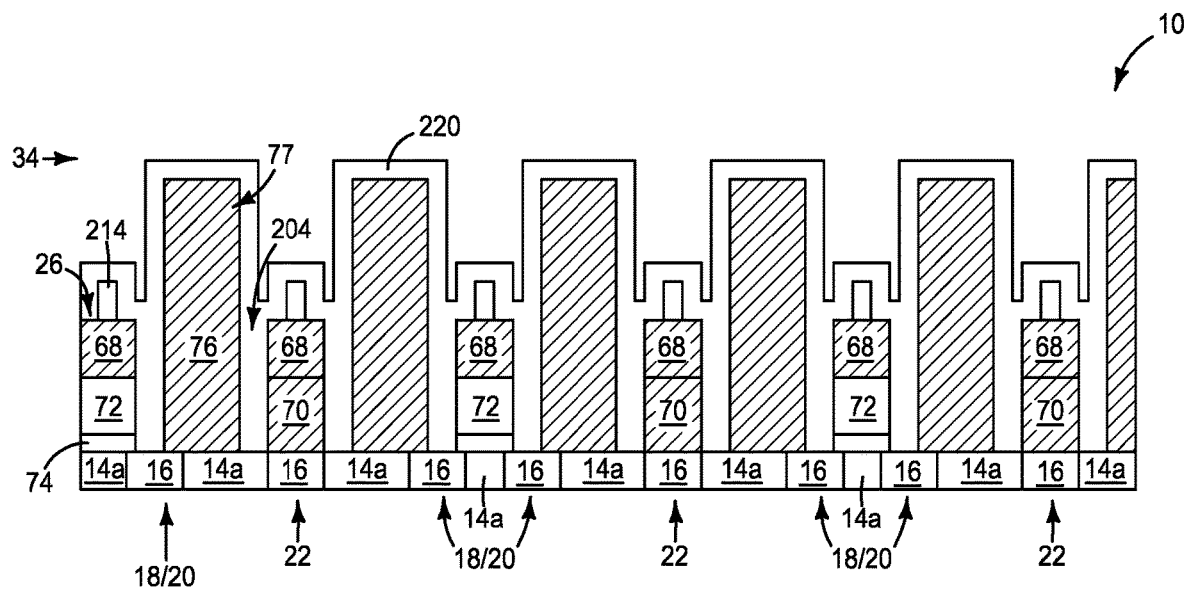
FIGS. 25 and 26 are diagrammatic cross-sectional side views along the same cross-sections as FIGS. 23 and 24 at an example process stage subsequent to that of FIGS. 23 and 24.
Figure 26:
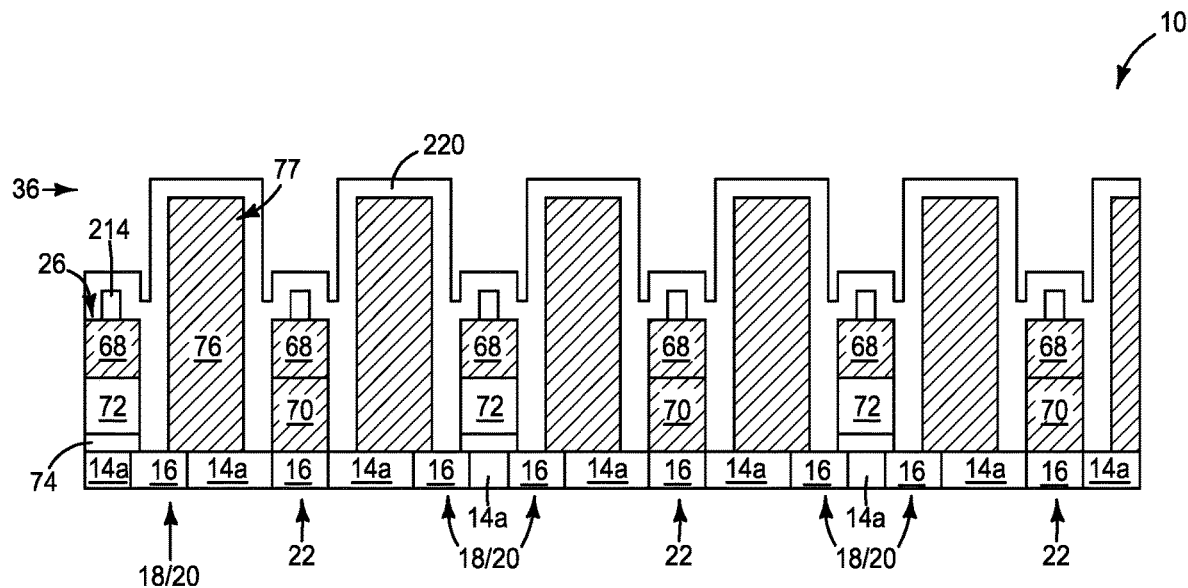

Referring to FIGS. 25 and 26, low-k dielectric material 220 is formed over the assembly 10 and within the void regions 204. In the shown embodiment, the low-k dielectric material entirely fills the void regions 204. In other regions, the low-k dielectric material may only partially fill the void regions.

The low-k dielectric material may comprise any suitable composition(s), and in some embodiments may comprise, consist essentially of, or consist of one or more of porous silicon dioxide, SiOC and SiOB, where the chemical formulas indicate primary constituents rather than specific stoichiometries. In some embodiments, the SiOC and SiOB may correspond to carbon-doped silicon dioxide and boron-doped silicon dioxide, respectively.

Figure 27:
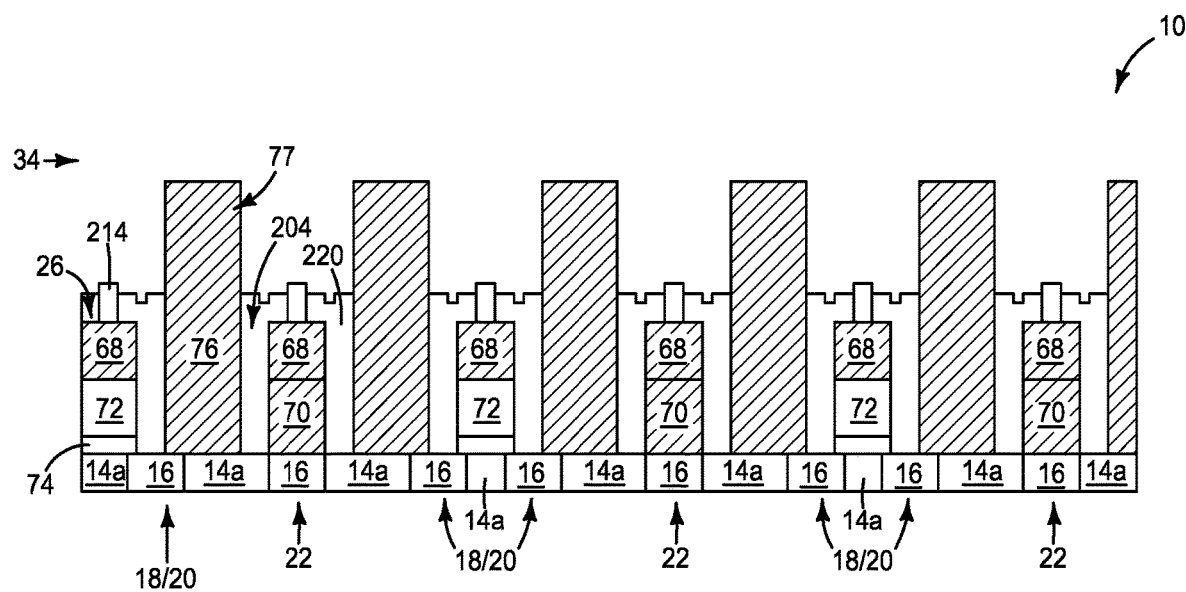
FIGS. 27 and 28 are diagrammatic cross-sectional side views along the same cross-sections as FIGS. 23 and 24 at an example process stage subsequent to that of FIGS. 25 and 26.
Figure 28:
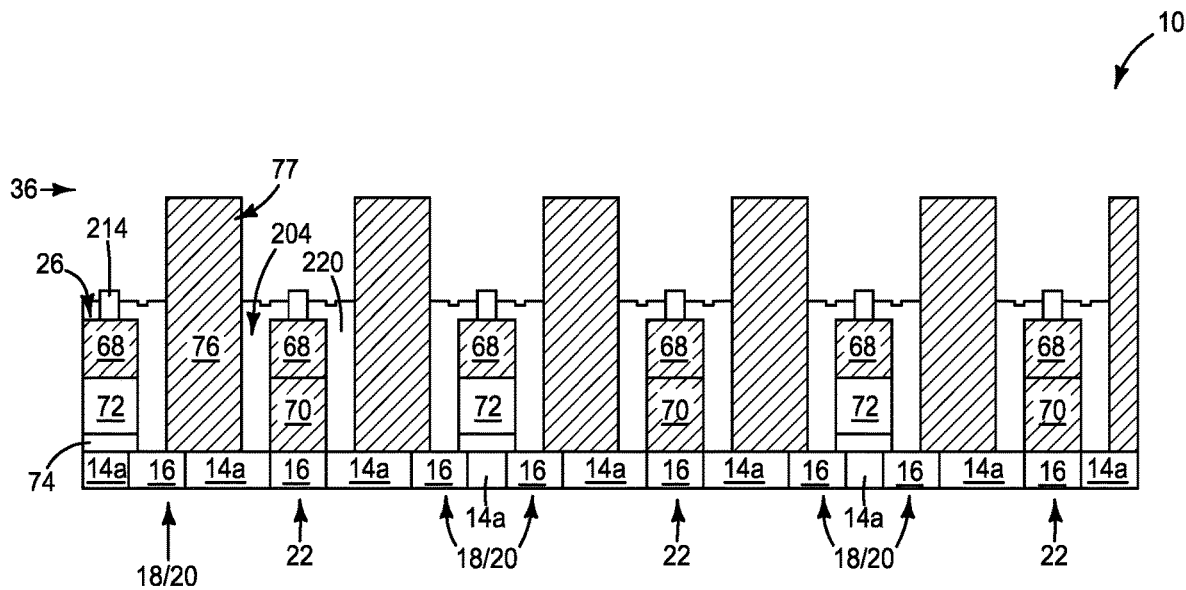

Referring to FIGS. 27 and 28, the low-k dielectric material 220 is removed from across upper surfaces of the conductive plugs 77. The remaining low-k dielectric material is shown to entirely filled the voids 204. In other embodiments, the material 220 may be removed to an extent such that the remaining material only partially fills the voids 204.

Figure 29:
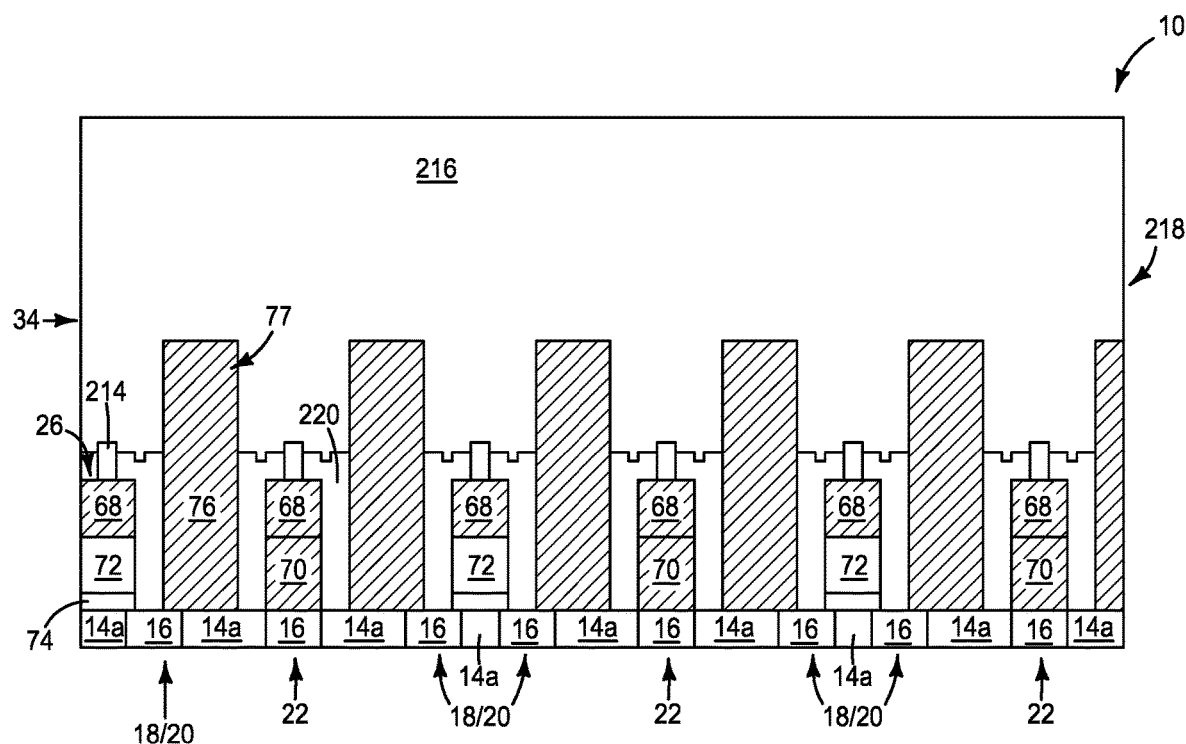
FIGS. 29 and 30 are diagrammatic cross-sectional side views along the same cross-sections as FIGS. 23 and 24 at an example process stage subsequent to that of FIGS. 27 and 28.
Figure 30:
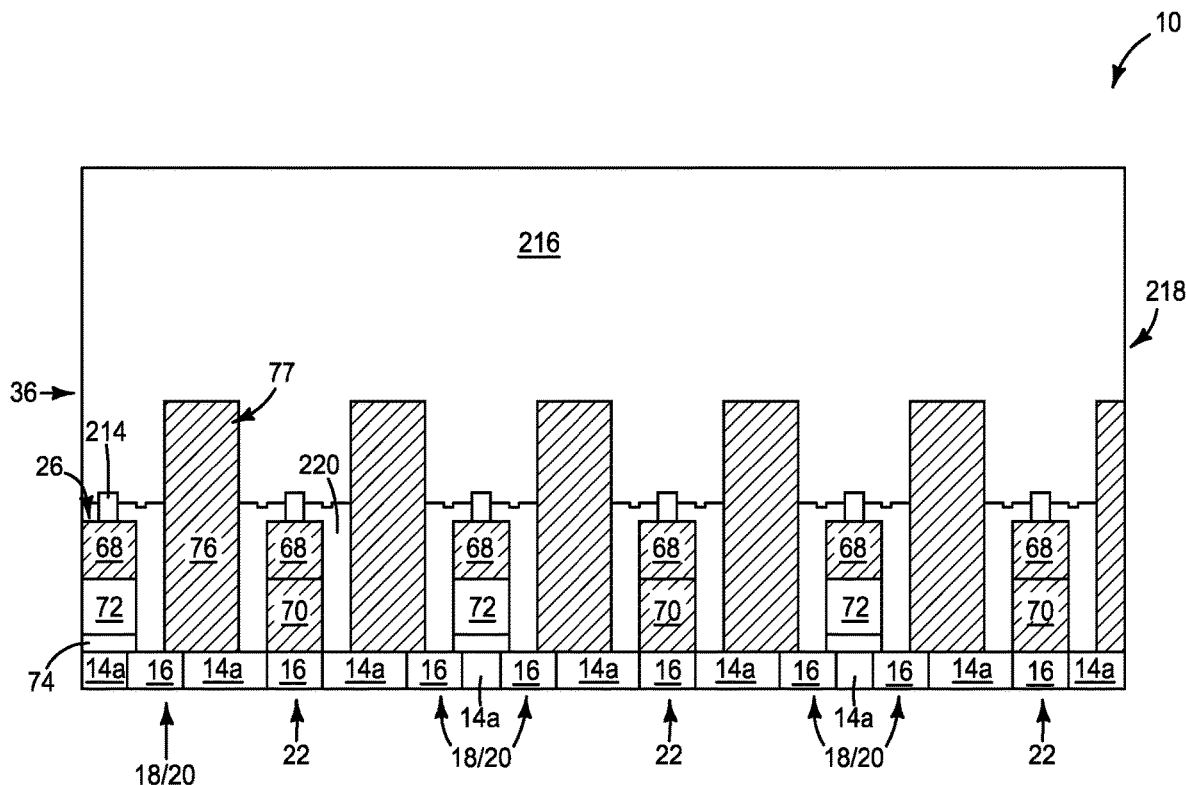

Referring to FIGS. 29 and 30, the insulative mass 218 of material 216 is formed over the conductive plugs 77 and over the low-k dielectric material 220.

Figure 31:
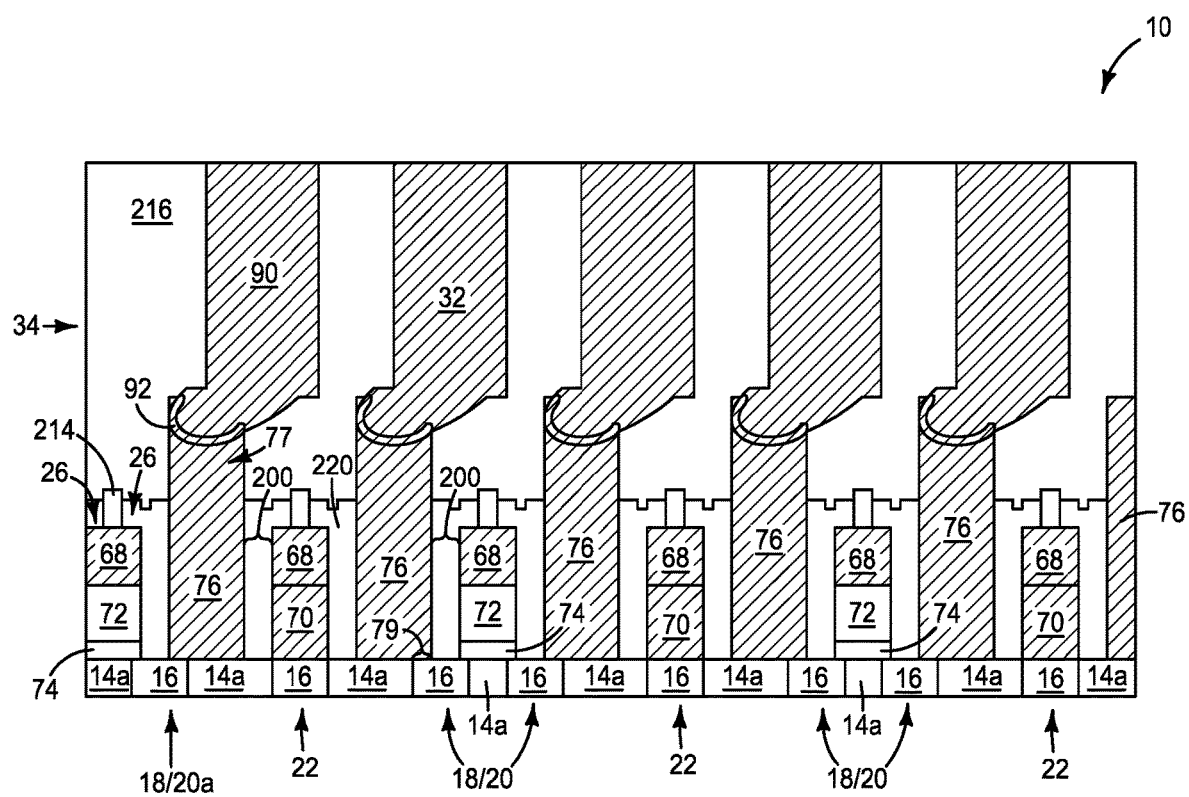
FIGS. 31 and 32 are diagrammatic cross-sectional side views along the same cross-sections as FIGS. 23 and 24 at an example process stage subsequent to that of FIGS. 29 and 30.
Figure 32:
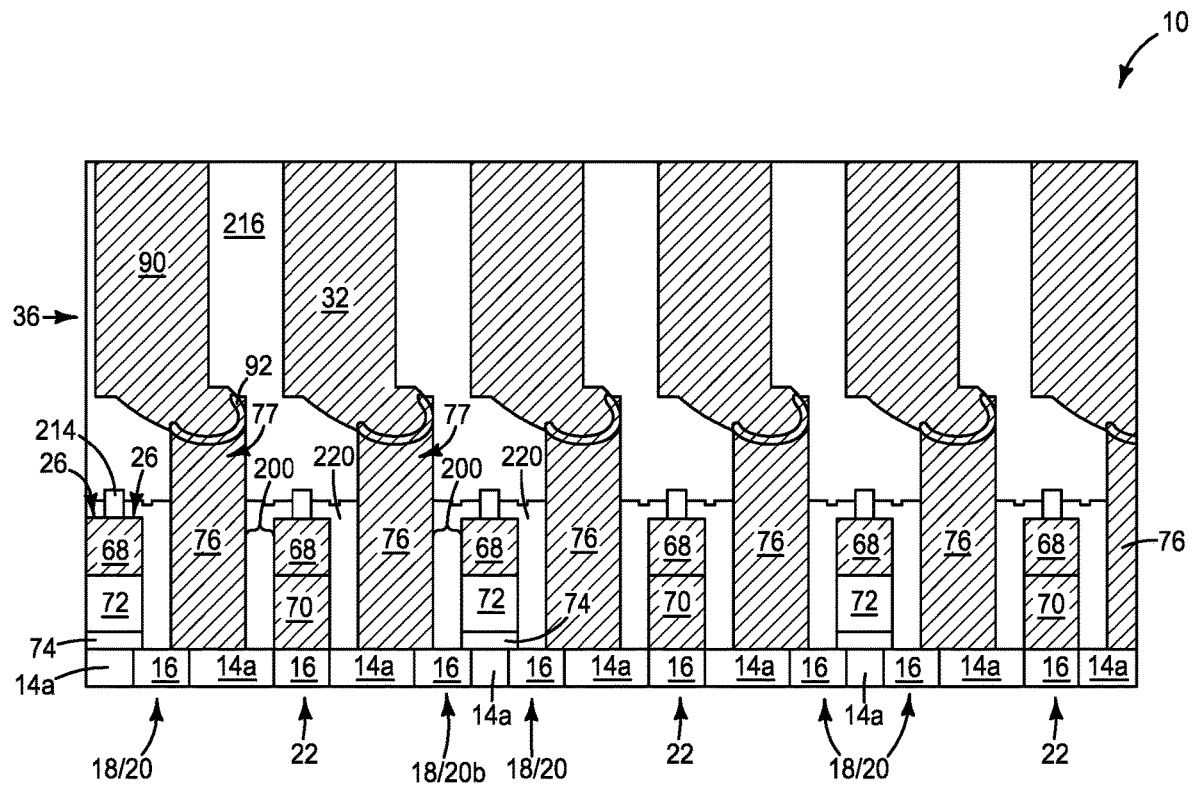

Referring to FIGS. 31 and 32 the materials 90 and 92 are formed with processing analogous to that described above with reference to FIGS. 17-22 to form the conductive redistribution material 32. The configuration of FIGS. 31 and 32 is similar to that of FIGS. 5 and 6, except that the low-k dielectric material 220 entirely fills the intervening regions 200 between the digit lines 26 and the conductive plugs 77.

Figure 33:
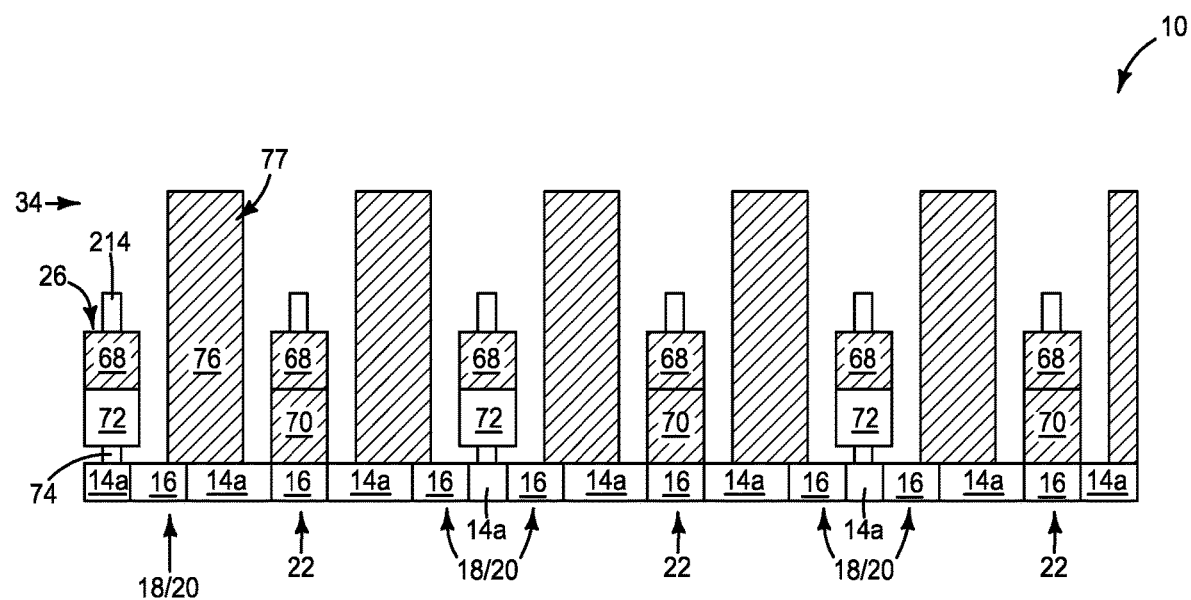
FIGS. 33 and 34 are diagrammatic cross-sectional side views along the same cross-sections as FIGS. 23 and 24 at an example process stage alternative to that of FIGS. 23 and 24.
Figure 34:
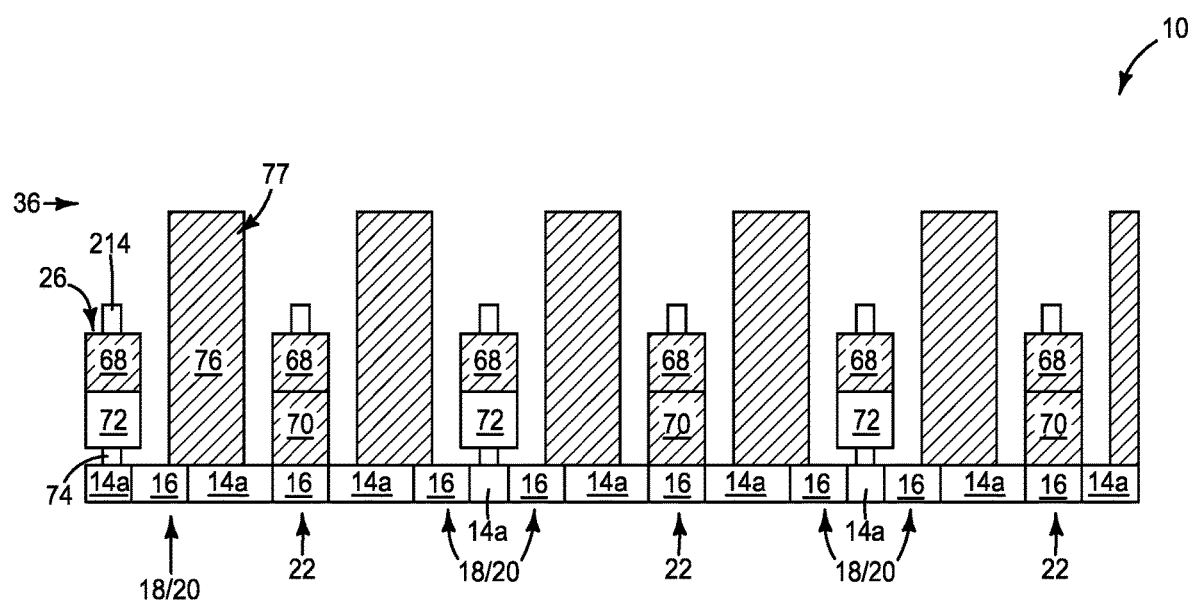
Figure 35:
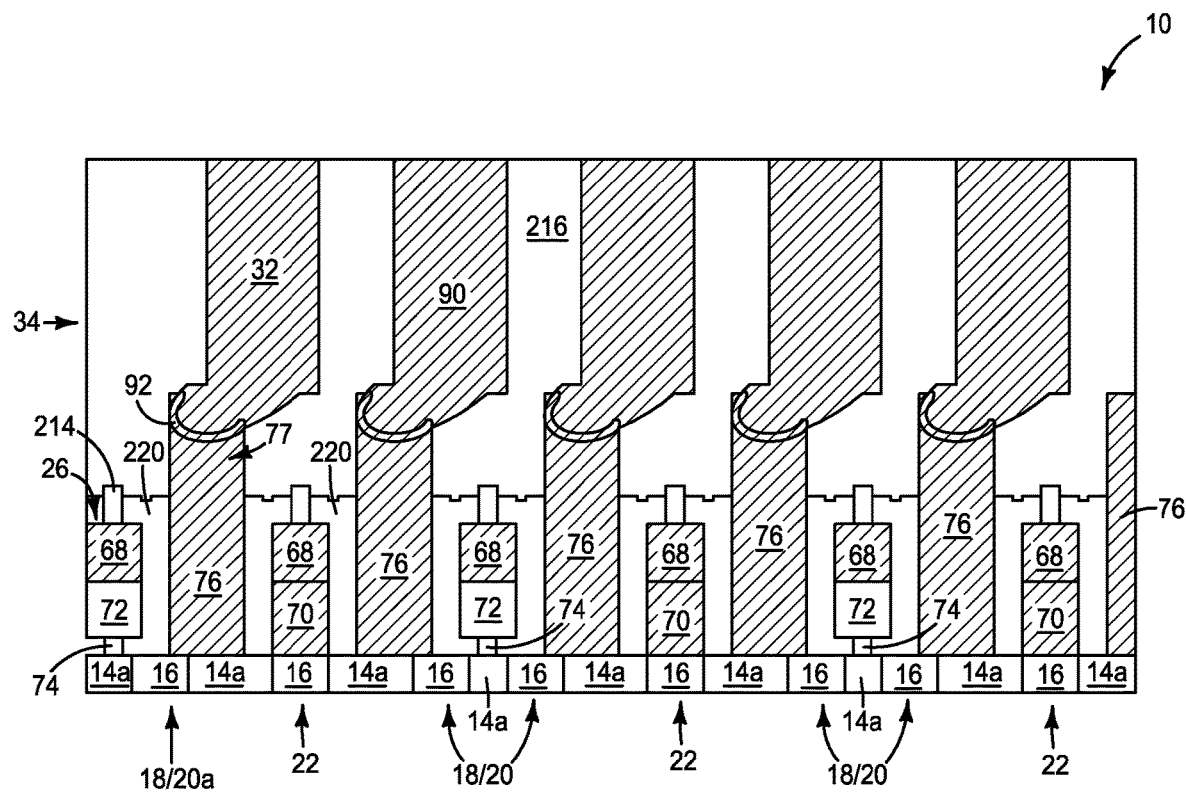
FIGS. 35 and 36 are diagrammatic cross-sectional side views along the same cross-sections as FIGS. 33 and 34 at an example process stage subsequent to that of FIGS. 33 and 34.
Figure 36:
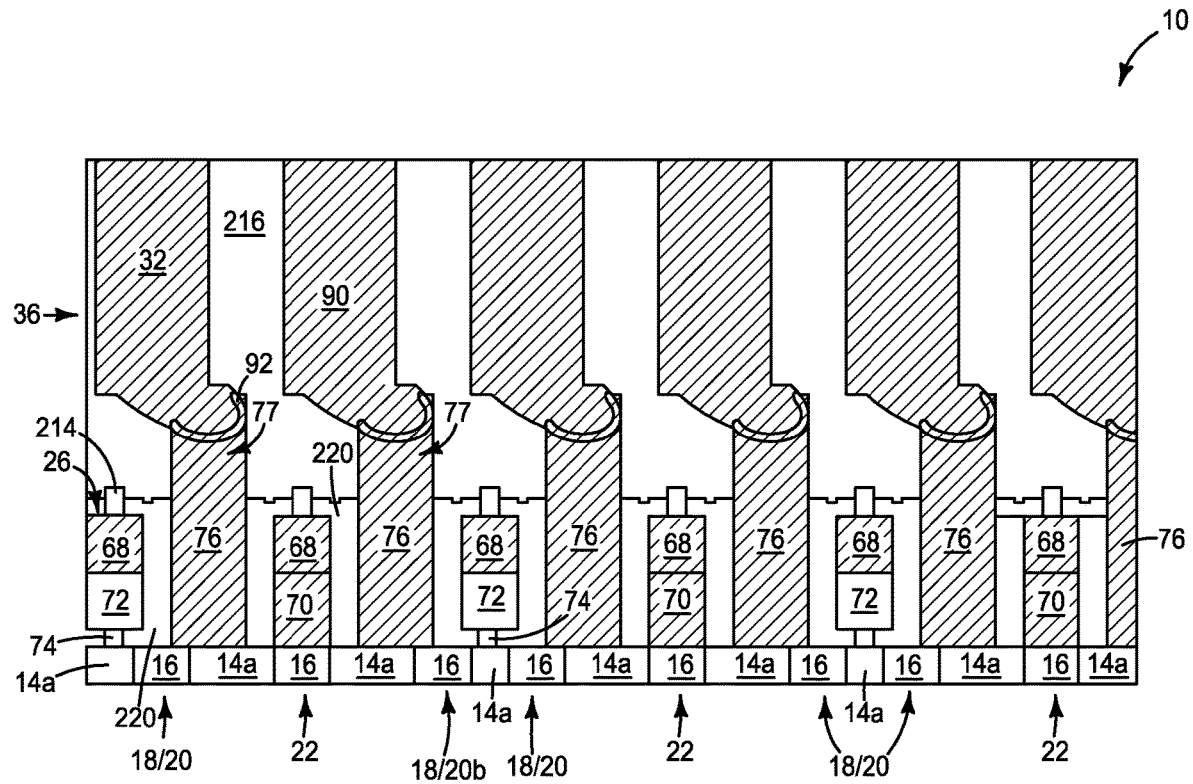

In the illustrated embodiment of FIGS. 31 and 32, the low-k dielectric material 220 extends across upper surfaces of the digit lines 26 due to the lateral thinning of the material 214. The material 220 does not extend under the digit lines. In other embodiments, the material 74 may be laterally thinned together with the material 214 during the removal of the sacrificial material 202. For instance FIGS. 33 and 34 show the integrated assembly 10 at a processing stage which may follow that of FIGS. 13 and 14, and which is analogous to that of FIGS. 23 and 24 except that the lower insulative material 74 is laterally thinned together with the material 214 during removal of the material 202. Subsequent processing forms the configuration shown in FIGS. 35 and 36, which is analogous to the configuration of FIGS. 31 and 32, but in which the low-k dielectric material 220 extends under some of the digit lines 26, and over some of the digit lines. In the illustrated embodiment, the material 220 extends over all of the digit lines within the cross-sections of FIGS. 35 and 36, but only extends under every other one of the digit lines along such cross-sections (specifically, only extends under the digit lines which are supported by the insulative materials 72 and 74).

Figure 37:
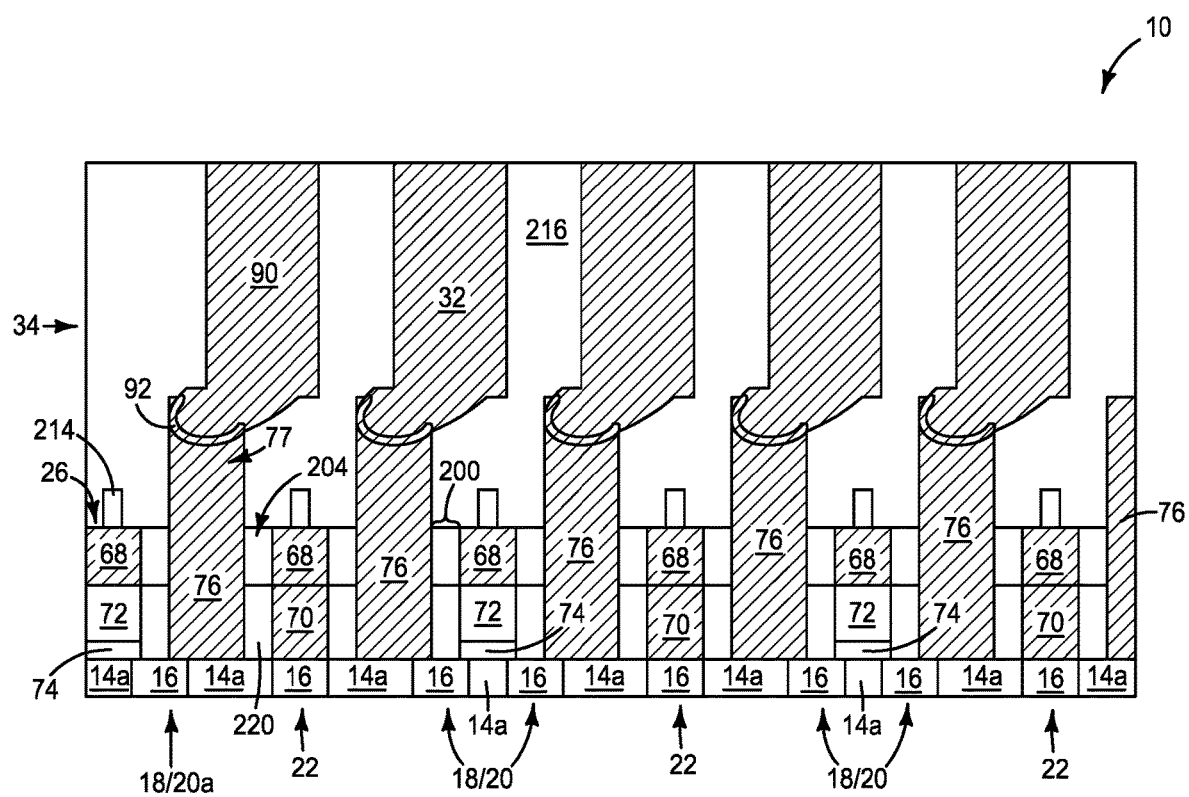
FIGS. 37 and 38 are diagrammatic cross-sectional side views along the same cross-sections as FIGS. 31 and 32 at an alternative process stage relative to that of FIGS. 31 and 32.
Figure 38:
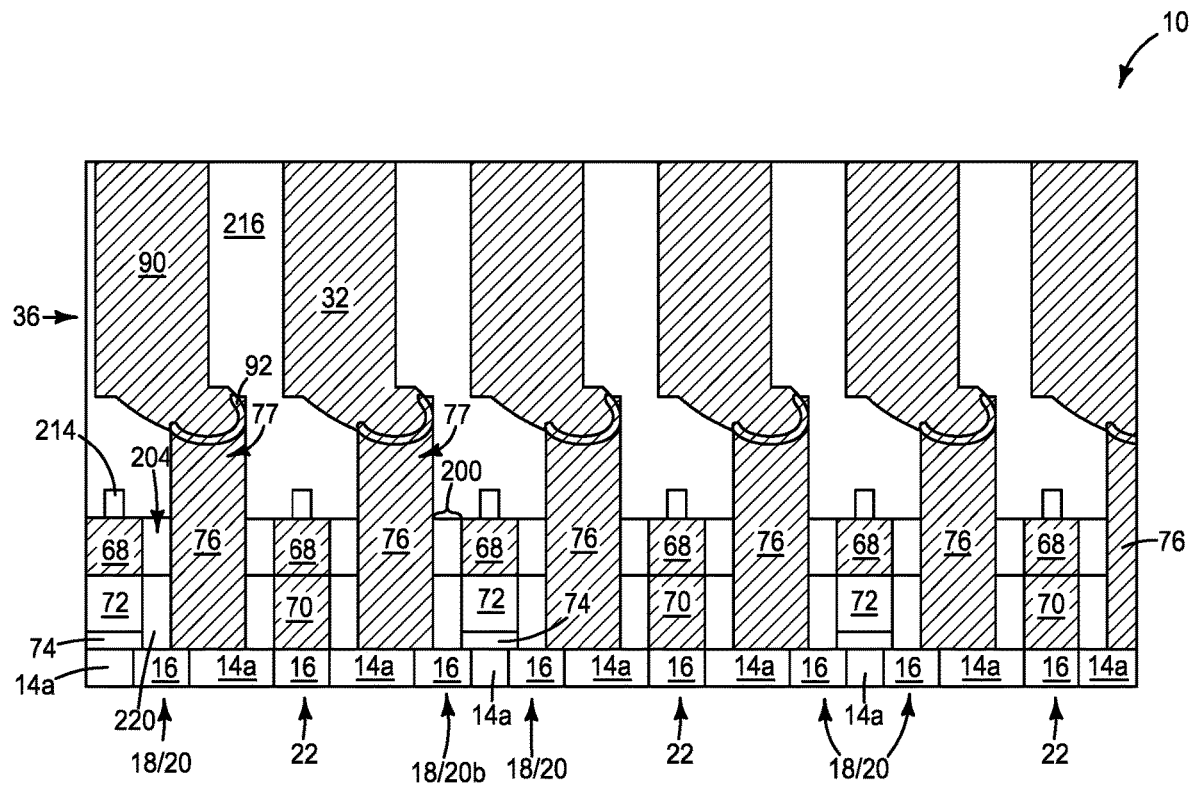

In some embodiments, the intervening regions 200 between the digit lines 26 may comprise both voids and low-k dielectric material. For instance, FIGS. 37 and 38 show regions of the integrated assembly 10 at a processing stage which may follow that of FIGS. 27 and 28, and in which the regions 200 comprise lower portions containing the low-k dielectric material 220, and comprise upper regions comprising voids 204. The assembly of FIGS. 37 and 38 may be formed by recessing the material 220 to beneath the digit lines 68 to leave voids 204 over the recessed material 220, and then sealing the voids 204 with the material 216.

Although FIGS. 37 and 38 show a configuration in which the intervening regions 200 comprise the void regions 204 over the low-k dielectric material, in other embodiments void regions may be laterally adjacent to the low-k dielectric material, and/or may be under the low-k dielectric material.

An advantage of utilizing one or both of void regions and low-k dielectric material within the intervening regions 200 is that such may enable the k values of such regions to be modulated (tailored) by adjusting the location(s) and thicknesses of the void regions and low-k-dielectric-material-containing-regions utilized within such intervening regions 200.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having active regions which each have a digit-line-contact-region between a pair of capacitor-contact-regions. The capacitor-contact-regions are arranged in a pattern such that six adjacent capacitor-contact-regions form a substantially rectangular configuration. Conductive plugs are coupled with the capacitor-contact-regions. Conductive redistribution material is coupled with the conductive plugs, and through the conductive plugs to the capacitor-contact-regions. The conductive redistribution material extends upwardly and laterally outwardly from the conductive plugs. Upper surfaces of the conductive redistribution material are arranged in a pattern such that seven adjacent of the upper surfaces form a unit of a substantially hexagonal-close-packed configuration. Digit lines are over the digit-line-contact-regions. Insulative regions are between the digit lines and the conductive plugs. The insulative regions contain one or both of voids and low-k dielectric material, with the voids and/or low-k dielectric material contacting upper surfaces of the capacitor-contact-regions. Capacitors are coupled with the upper surfaces of the conductive redistribution material.

Some embodiments include an integrated assembly having semiconductor-material-pillars which each have a digit-line-contact-region between a pair of capacitor-contact-regions. The capacitor-contact-regions are arranged in an array, with the array having alternating first and second rows. Conductive plugs are coupled with the capacitor-contact-regions. Conductive redistribution material is coupled with the conductive plugs, and through the conductive plugs to the capacitor-contact-regions. The conductive redistribution material has a first configuration along the first rows, with the first configuration extending laterally outwardly from the capacitor-contact-regions of the first rows in a first direction substantially along the first rows. The conductive redistribution material has a second configuration along the second rows, with the second configuration extending laterally outwardly from the capacitor-contact-regions of the second rows in a second direction substantially along the second rows. The second direction is substantially opposite to the first direction. The conductive redistribution material has upper surfaces. Digit lines are over the digit-line-contact-regions. Insulative regions are between the digit lines and the conductive plugs. The insulative regions comprise one or both of voids and low-k dielectric material, with the voids and/or low-k dielectric material contacting upper surfaces of the capacitor-contact-regions. Capacitors are coupled with the upper surfaces of the conductive redistribution material.

Some embodiments include a method of forming an integrated assembly. A construction is formed to have semiconductor-material-pillars which each have a digit-line-contact-region between a pair of capacitor-contact-regions. The capacitor-contact-regions are arranged in an array, with the array having alternating first and second rows. The digit-line-contact-regions are spaced from the capacitor-contact-regions along a first cross-section along the first rows, and are spaced from the capacitor-contact-regions along a second cross-section along the second rows. Digit lines are directly over the digit-line-contact-regions along the first and second cross-sections. Conductive plugs are directly over the capacitor-contact-regions along the first and second cross-sections. Sacrificial material is between the conductive plugs and the digit lines. The sacrificial material is removed to form void regions. An insulative mass is formed to extend across the conductive plugs. First openings are formed to extend to the conductive plugs along the first cross-section, and second openings are formed to extend to the conductive plugs along the second cross-section. The first and second openings have a first shape and a second shape, respectively, with the second shape being substantially a mirror image of the first shape. Conductive redistribution material is formed within the first and second shapes of the first and second openings. Capacitors are formed to be coupled with the conductive redistribution material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:
1. An integrated assembly, comprising:
   active regions which each have a digit-line-contact-region between a pair of capacitor-contact-regions, the capacitor-contact-regions being arranged in a pattern such that six adjacent capacitor-contact-regions form a substantially rectangular configuration;
   conductive plugs coupled with the capacitor-contact-regions;

conductive redistribution material coupled with the conductive plugs, and through the conductive plugs to the capacitor-contact-regions; the conductive redistribution material extending upwardly and laterally outwardly from the conductive plugs; upper surfaces of the conductive redistribution material being arranged in a pattern such that seven adjacent of the upper surfaces form a unit of a substantially hexagonal-close-packed configuration;

digit lines over the digit-line-contact-regions;

insulative regions between the digit lines and the conductive plugs; the insulative regions comprising one or both of voids and low-k dielectric material, with the voids and/or low-k dielectric material contacting upper surfaces of the capacitor-contact-regions; and capacitors coupled with the upper surfaces of the conductive redistribution material.

2. The integrated assembly of claim 1 wherein:
the capacitor-contact-regions are arranged in an array;
the array has alternating first and second rows;
the conductive redistribution material has a first configuration along the first rows, with the first configuration extending laterally outwardly from the capacitor-contact-regions of the first rows in a first direction substantially along the first rows; and the conductive redistribution material has a second configuration along the second rows, with the second configuration extending laterally outwardly from the capacitor-contact-regions of the second rows in a second direction substantially along the second rows; the second direction being substantially opposite to the first direction.

3. The integrated assembly of claim 1 wherein:
the active regions are pillars of semiconductor material;
each of the pillars has two trenches extending therein, with the two trenches being a first trench and a second trench;
each of the pillars has two of the capacitor-contact-regions and one of the digit-line-contact-regions, with the two capacitor-contact-regions being a first capacitor-contact-region and a second capacitor-contact-region;
a first wordline is within the first trench and gatedly couples the first capacitor-contact-region to the digit-line-contact region; and
a second wordline is within the second trench and gatedly couples the second capacitor-contact-region to the digit-line-contact region.

4. The integrated assembly of claim 1 wherein the conductive plugs comprise conductive-doped semiconductor material.

5. The integrated assembly of claim 1 wherein the conductive plugs comprise conductive-doped silicon.

6. The integrated assembly of claim 1 wherein the insulative regions comprise the voids.

7. The integrated assembly of claim 1 wherein the insulative regions comprise the low-k dielectric material.

8. The integrated assembly of claim 1 wherein the insulative regions comprise the voids and the low-k dielectric material.

9. The integrated assembly of claim 1 wherein the conductive redistribution material comprises metal over metal silicide.

10. The integrated assembly of claim 9 wherein the metal consists essentially of one or both of tungsten and titanium; and wherein the metal silicide comprises one or more cobalt silicide, tungsten silicide and titanium silicide.

11. The integrated assembly of claim 1 wherein the insulative regions extend over the digit lines.

12. The integrated assembly of claim 1 wherein the insulative regions extend under at least some of the digit lines.

13. The integrated assembly of claim 1 wherein the insulative regions include low-k dielectric material extending over all of the digit lines and extending under some of the digit lines.

14. An integrated assembly, comprising:
semiconductor-material-pillars which each have a digit-line-contact-region between a pair of capacitor-contact-regions; the capacitor-contact-regions being arranged in an array, with the array having alternating first and second rows;
conductive plugs coupled with the capacitor-contact-regions;
conductive redistribution material coupled with the conductive plugs, and through the conductive plugs to the capacitor-contact-regions; the conductive redistribution material having a first configuration along the first rows, with the first configuration extending laterally outwardly from the capacitor-contact-regions of the first rows in a first direction substantially along the first rows; the conductive redistribution material having a second configuration along the second rows, with the second configuration extending laterally outwardly from the capacitor-contact-regions of the second rows in a second direction substantially along the second rows; the second direction being substantially opposite to the first direction; the conductive redistribution material having upper surfaces;
digit lines over the digit-line-contact-regions;
insulative regions between the digit lines and the conductive plugs; the insulative regions comprising one or both of voids and low-k dielectric material, with the voids and/or low-k dielectric material contacting upper surfaces of the capacitor-contact-regions; and
capacitors coupled with the upper surfaces of the conductive redistribution material.

15. The integrated assembly of claim 14 the insulative regions comprise the voids.

16. The integrated assembly of claim 14 wherein the insulative regions comprise the low-k dielectric material.

17. The integrated assembly of claim 14 wherein the insulative regions comprise the voids and the low-k dielectric material.

18. The integrated assembly of claim 14 wherein the conductive redistribution material is above the digit lines and partially laterally overlaps the digit lines.

19. The integrated assembly of claim 14 wherein:
the digit-line-contact-regions are spaced from the capacitor-contact-regions along a cross-section along the first rows;
the digit lines are directly over the digit-line-contact-regions along the cross-section;
an insulative mass is over the conductive plugs and the digit lines; and the conductive redistribution material extends downwardly through the insulative mass and into the conductive plugs along the cross-section.

20. The integrated assembly of claim 19 wherein the conductive plugs comprise conductively-doped semiconductor material.

21. The integrated assembly of claim 19 wherein the conductive plugs comprise conductively-doped silicon.

22. The integrated assembly of claim 19 wherein the conductive redistribution material is configured as boot-shaped structures along the cross-section, with each of the boot-shaped structures have a toe region extending into one of the conductive plugs and having a heel region directly over one of the digit lines.

23. The integrated assembly of claim 22 wherein:
the conductive redistribution material comprises a composition consisting essentially of one or both of tungsten and titanium; and
the toe regions of the boot-shaped structures comprise metal silicide.

24. The integrated assembly of claim 23 wherein the metal silicide comprises one or more of CoSi, WSi and TiSi, where the chemical formulas indicate primary constituents rather than specific stoichiometries.

25. The integrated assembly of claim 22 wherein:
the cross-section is a first cross-section and the boot-shaped structures are first boot-shaped structures;
the digit-line-contact-regions are spaced from the capacitor-contact-regions along a second cross-section along the second rows; and
the conductive redistribution material is configured as second boot-shaped structures along the second cross-section, with the second boot-shaped structures being substantially mirror images of the first boot-shaped structures.

* * * * *